US009948267B2

(12) United States Patent
Yamane et al.

(10) Patent No.: US 9,948,267 B2
(45) Date of Patent: Apr. 17, 2018

(54) MAGNETORESISTIVE EFFECT DEVICE

(71) Applicant: TDK CORPORATION, Tokyo (JP)

(72) Inventors: Takekazu Yamane, Tokyo (JP);
Tetsuya Shibata, Tokyo (JP); Junichiro Urabe, Tokyo (JP); Atsushi Shimura, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/439,640

(22) Filed: Feb. 22, 2017

(65) Prior Publication Data
US 2017/0244377 A1 Aug. 24, 2017

(30) Foreign Application Priority Data

Feb. 23, 2016 (JP) ................... 2016-031569
Nov. 24, 2016 (JP) ................... 2016-227868

(51) Int. Cl.
*H03K 3/45* (2006.01)
*H03H 7/06* (2006.01)
*H01L 43/02* (2006.01)
*H01L 43/08* (2006.01)
*H01L 43/10* (2006.01)

(52) U.S. Cl.
CPC ............. *H03H 7/06* (2013.01); *H01L 43/02* (2013.01); *H01L 43/08* (2013.01); *H01L 43/10* (2013.01)

(58) Field of Classification Search
None
See application file for complete search history.

(56) References Cited

U.S. PATENT DOCUMENTS

| 9,425,738 | B2 * | 8/2016 | Wang | H03B 15/006 |
| 2011/0038198 | A1 * | 2/2011 | Kent | H01F 10/193 365/158 |
| 2015/0179198 | A1 * | 6/2015 | Ong | G11B 5/596 360/31 |
| 2016/0277000 | A1 * | 9/2016 | Shibata | H03H 2/00 |
| 2017/0345449 | A1 * | 11/2017 | Shibata | G11B 5/3945 |

OTHER PUBLICATIONS

Beaujour et al., "Ferromagnetic resonance study of polycrystalline cobalt ultrathin films," Journal of Applied Physics, 2006, vol. 99, 08N503, pp. 1-3.

(Continued)

*Primary Examiner* — Cassandra Cox
(74) *Attorney, Agent, or Firm* — Oliff PLC

(57) ABSTRACT

A magnetoresistive effect device includes at least one magnetoresistive effect element including a magnetization fixed layer, a spacer layer, and a magnetization free layer, a first port, a second port, a first signal line which is connected to the first port and through which high-frequency current corresponding to a high-frequency signal input into the first port flows, a second signal line, and a direct-current input terminal. The magnetoresistive effect element is arranged so that a high-frequency magnetic field occurring from the first signal line is applied to the magnetization free layer. The magnetoresistive effect element is connected to the second port via the second signal line. The direct-current input terminal is connected to the magnetoresistive effect element.

11 Claims, 18 Drawing Sheets

(56) References Cited

OTHER PUBLICATIONS

Schumacher et al., "Precessional switching of the magnetization in microscopic magnetic tunnel junctions," Journal of Applied Physics, May 15, 2003, vol. 93, No. 10, pp. 7290-7294.
Bilzer et al., "Vector network analyzer ferromagnetic resonance of thin films on coplanar waveguides: Comparison of different evaluation methods," Journal of Applied Physics, 2007, vol. 101, 074505, pp. 1-5.
Kalarickal et al., "Ferromagnetic resonance linewidth in metallic thin films: Comparison of measurement methods," Journal of Applied Physics, 2006, vol. 99, 093909, pp. 1-7.

* cited by examiner

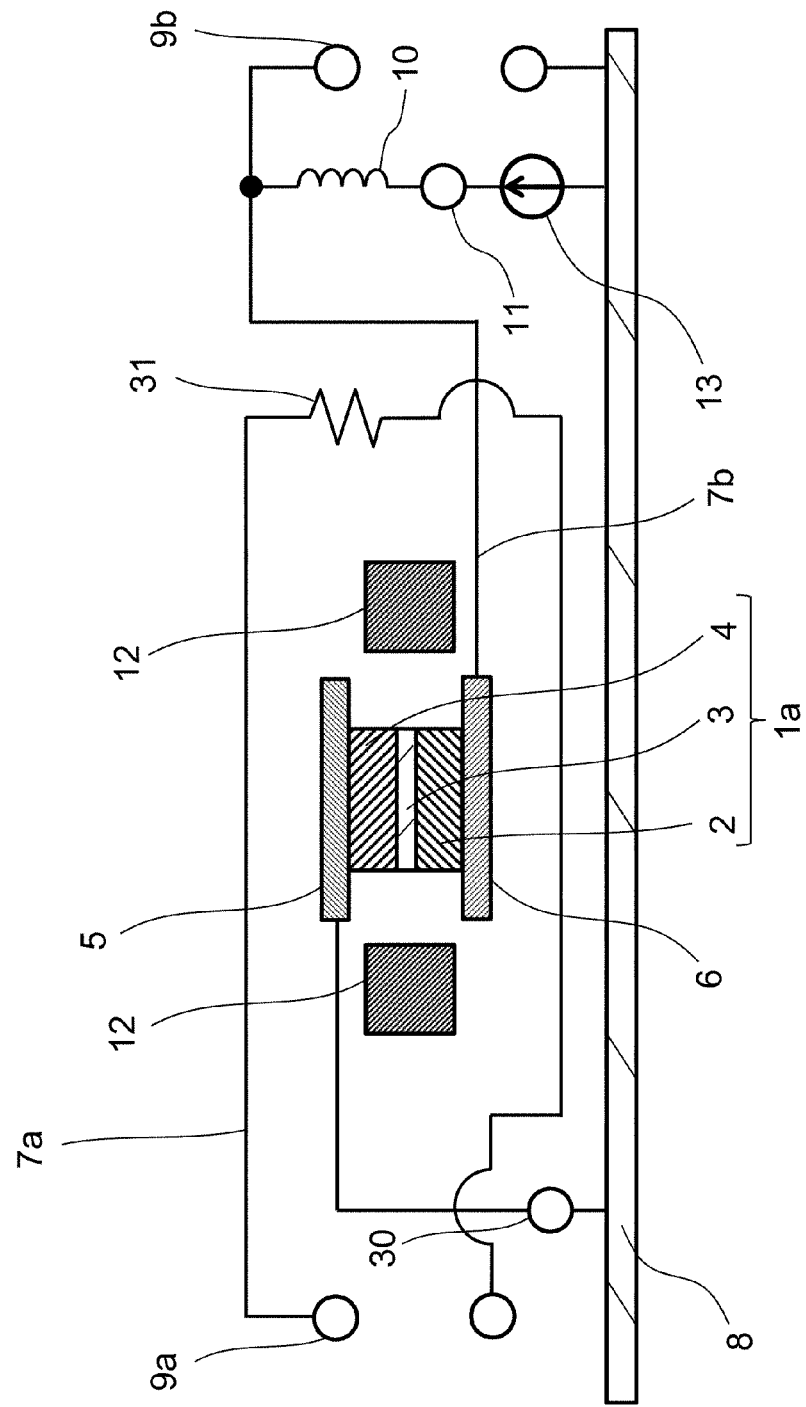

MAGNETORESISTIVE EFFECT DEVICE

BACKGROUND OF THE INVENTION

1. Field of the Invention

The present invention relates to a magnetoresistive effect device including a magnetoresistive effect element.

2. Description of the Related Art

The speed of wireless communication has increased in recent years with the increasing functions of mobile communication terminals, such as mobile phones. Since the communication speed is proportional to the band width of frequencies that are used, the number of frequency bands necessary for communication is increased. Accordingly, the number of high-frequency filters that are mounted in mobile communication terminals is increased. Spintronics has been studied in recent years as a field that is probably applicable to new high-frequency components. One phenomenon that has received attention is ferromagnetic resonance phenomenon caused by a magnetoresistive effect element (refer to Journal of Applied Physics 99, 08N503, 17 Nov. 17 2006). Application of an alternating-current magnetic field to a ferromagnetic film of the magnetoresistive effect element causes ferromagnetic resonance in magnetization of the ferromagnetic film, and the magnetization of the ferromagnetic film greatly oscillates at frequencies near a ferromagnetic resonance frequency. The ferromagnetic resonance frequency of the ferromagnetic film is generally within a high-frequency band from several gigahertz to several tens of gigahertz.

SUMMARY OF THE INVENTION

Although the magnetoresistive effect element may be applied to a high-frequency device utilizing the ferromagnetic resonance phenomenon, specific configurations to apply the magnetoresistive effect element to the high-frequency device, such as a high-frequency filter, have not been proposed. Accordingly, the present invention aims to provide a magnetoresistive effect device capable of realizing a high-frequency device, such as a high-frequency filter, that includes a magnetoresistive effect element.

A magnetoresistive effect device according to an embodiment of the present invention includes at least one magnetoresistive effect element including a magnetization fixed layer, a spacer layer, and a magnetization free layer the direction of magnetization of which is capable of being varied; a first port into which a high-frequency signal is input; a second port from which a high-frequency signal is output; a first signal line which is connected to the first port and through which high-frequency current corresponding to the high-frequency signal input into the first port flows; a second signal line; and a direct-current input terminal. The magnetoresistive effect element is arranged so that a high-frequency magnetic field occurring from the first signal line is applied to the magnetization free layer. The magnetoresistive effect element is connected to the second port via the second signal line. The direct-current input terminal is connected to the magnetoresistive effect element.

The magnetoresistive effect device is capable of having frequency characteristics as a high-frequency filter that is capable of selectively passing the high-frequency signals having frequencies near a ferromagnetic resonance frequency of the magnetization free layer. In addition, the magnetoresistive effect device is also capable of functioning as an isolator. Furthermore, since varying the direct current applied from the direct-current input terminal enables the ferromagnetic resonance frequency of the magnetization free layer to be variably controlled, the magnetoresistive effect device is also capable of functioning as, for example, a variable frequency filter or an isolator. Furthermore, the magnetoresistive effect device is also capable of functioning as a phase shifter capable of varying the phase of a signal, an amplifier capable of amplification of a signal, or a balun.

The magnetoresistive effect device may further include at least one frequency setting mechanism capable of setting a ferromagnetic resonance frequency of the magnetization free layer.

Since the magnetoresistive effect device is capable of setting the ferromagnetic resonance frequency of the magnetization free layer to an arbitrary frequency, the magnetoresistive effect device is capable of functioning as, for example, a filter for an arbitrary frequency band or an isolator.

In the magnetoresistive effect device, the frequency setting mechanism may be an effective magnetic field setting mechanism capable of setting an effective magnetic field in the magnetization free layer and the ferromagnetic resonance frequency of the magnetization free layer may be varied by varying the effective magnetic field.

The magnetoresistive effect device is capable of functioning as a variable frequency filter or an isolator.

In the magnetoresistive effect device, it is preferred that the angle formed by a straight line parallel to the direction of magnetization of the magnetization fixed layer and a straight line parallel to the direction of the high-frequency magnetic field in the magnetization free layer be greater than or equal to five degrees and be smaller than or equal to 65 degrees. "The angle formed by a straight line parallel to the direction of magnetization and a straight line parallel to the direction of the high-frequency magnetic field" means a smaller angle, among the angles formed by the straight line parallel to the direction of magnetization and the straight line parallel to the direction of the high-frequency magnetic field.

With the above magnetoresistive effect device, the high-frequency signals with higher strengths are supplied from the magnetoresistive effect element to the second port at frequencies near the ferromagnetic resonance frequency of the magnetization free layer.

In the magnetoresistive effect device, it is preferred that the angle formed by a straight line parallel to the direction of magnetization of the magnetization fixed layer and a straight line parallel to the direction of the high-frequency magnetic field in the magnetization free layer be greater than or equal to 20 degrees and be smaller than or equal to 55 degrees.

With the above magnetoresistive effect device, the high-frequency signals with much higher strengths are supplied from the magnetoresistive effect element to the second port at frequencies near the ferromagnetic resonance frequency of the magnetization free layer.

In the magnetoresistive effect device, the at least one magnetoresistive effect element may include multiple magnetoresistive effect elements differing in their ferromagnetic resonance frequencies of the magnetization free layers and the multiple magnetoresistive effect elements may be connected in parallel to each other.

The above magnetoresistive effect device is capable of providing the passband having a certain width. Accordingly, the magnetoresistive effect device is capable of functioning as, for example, a filter having a passband of a certain width or an isolator. In addition, the magnetoresistive effect device is also capable of functioning as a phase shifter, an amplifier, or a balun, which use the passband as an operating band.

In the magnetoresistive effect device, the at least one magnetoresistive effect element may include multiple magnetoresistive effect elements and the multiple magnetoresistive effect elements may be connected in parallel to each other. The at least one frequency setting mechanism may include multiple frequency setting mechanisms so as to individually set the ferromagnetic resonance frequencies of the magnetization free layers in the multiple magnetoresistive effect elements.

The above magnetoresistive effect device is capable of providing the passband having a certain width. Accordingly, the magnetoresistive effect device is capable of functioning as, for example, a filter having a passband of a certain width or an isolator. In addition, the magnetoresistive effect device is also capable of functioning as a phase shifter, an amplifier, or a balun, which use the passband as the operating band.

In the magnetoresistive effect device, the at least one magnetoresistive effect element may include multiple magnetoresistive effect elements differing in their ferromagnetic resonance frequencies of the magnetization free layers and the multiple magnetoresistive effect elements may be connected in series to each other.

The above magnetoresistive effect device is capable of providing the passband having a certain width. Accordingly, the magnetoresistive effect device is capable of functioning as, for example, a filter having a passband of a certain width or an isolator. In addition, the magnetoresistive effect device is also capable of functioning as a phase shifter, an amplifier, or a balun, which use the passband as the operating band.

In the magnetoresistive effect device, the at least one magnetoresistive effect element may include multiple magnetoresistive effect elements and the multiple magnetoresistive effect elements may be connected in series to each other. The at least one frequency setting mechanism may include multiple frequency setting mechanisms so as to individually set the ferromagnetic resonance frequencies of the magnetization free layers in the multiple magnetoresistive effect elements.

The above magnetoresistive effect device is capable of providing the passband having a certain width. Accordingly, the magnetoresistive effect device is capable of functioning as, for example, a filter having a passband of a certain width or an isolator. In addition, the magnetoresistive effect device is also capable of functioning as a phase shifter, an amplifier, or a balun, which use the passband as the operating band.

In the magnetoresistive effect device, the plan view shapes of the multiple magnetoresistive effect elements differing in their ferromagnetic resonance frequencies of the magnetization free layers preferably have different aspect ratios. The "plan view shape" means the shape of the magnetoresistive effect element when the magnetoresistive effect element is viewed from above a plane perpendicular to the stacking direction of the respective layers composing the magnetoresistive effect element. "The aspect ratio" means the ratio of the length of long sides to the length of short sides of a rectangle circumscribed around the plan view shape of the magnetoresistive effect element with a minimum area.

With the above magnetoresistive effect device, it is possible to manufacture the multiple magnetoresistive effect elements differing in their ferromagnetic resonance frequencies of the magnetization free layers through the same process. Specifically, since the multiple magnetoresistive effect elements have the same film structure in the magnetoresistive effect device, it is possible to collectively form the films of the layers composing the multiple magnetoresistive effect elements.

According to the present invention, it is possible to provide a magnetoresistive effect device capable of realizing a high-frequency device, such as a high-frequency filter, that includes a magnetoresistive effect element.

BRIEF DESCRIPTION OF THE DRAWINGS

FIG. 19 is a schematic cross-sectional view illustrating an exemplary configuration of a magnetoresistive effect device according to a modification of the first embodiment.

DESCRIPTION OF THE PREFERRED EMBODIMENTS

Embodiments of the present invention will herein be described in detail with reference to the attached drawings. The present invention is not limited by the content described in the following embodiments. Components described below include components easily supposed by persons skilled in the art, components substantially equivalent to each other, and components within equivalent ranges. In addition, the components described below may be appropriately combined with each other. Furthermore, the components may be omitted, replaced, or modified without departing from the true spirit and scope of the invention.

First Embodiment

Figure 1:
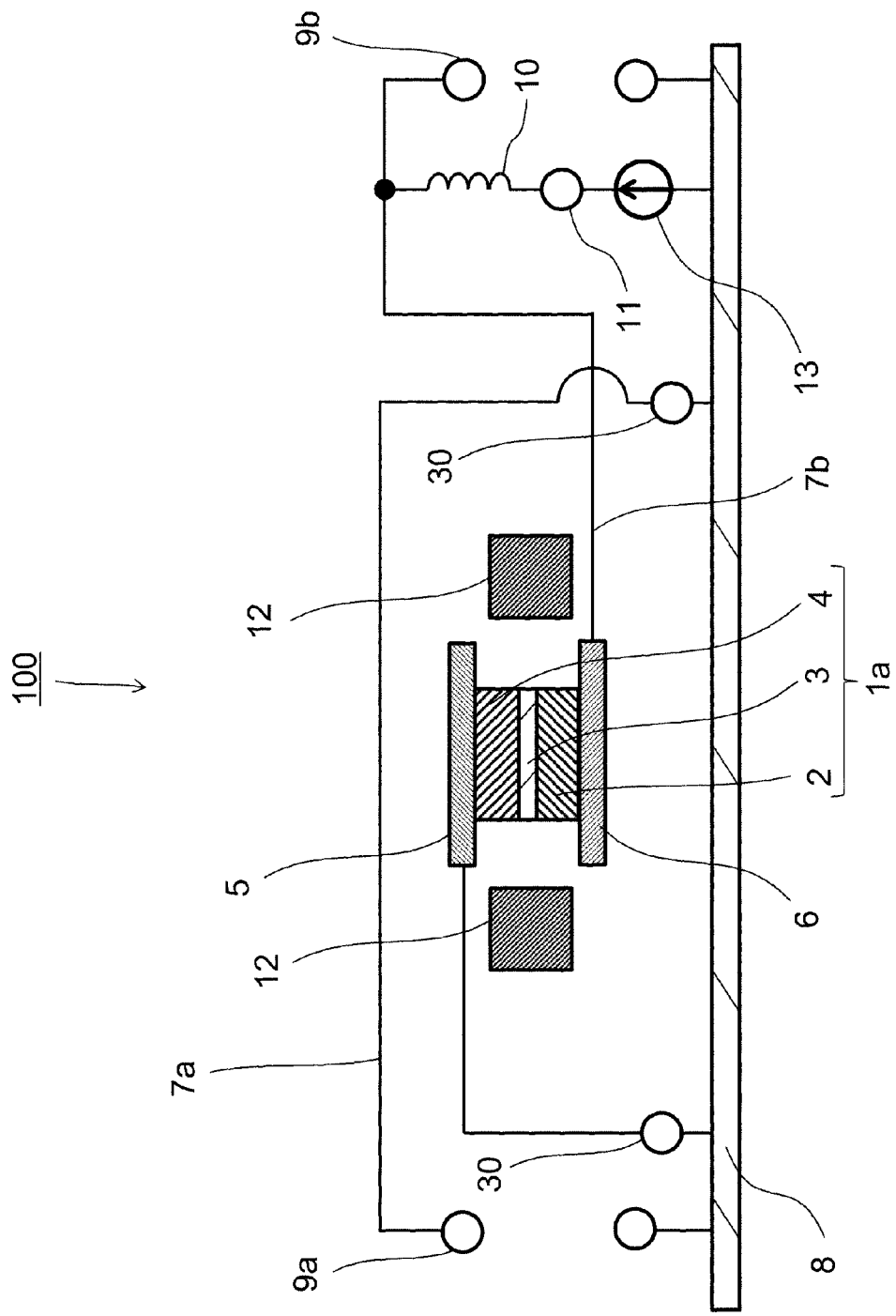
FIG. 1 is a schematic cross-sectional view illustrating an exemplary configuration of a magnetoresistive effect device according to a first embodiment.

FIG. 1 is a schematic cross-sectional view of a magnetoresistive effect device 100 according to a first embodiment of the present invention. The magnetoresistive effect device 100 includes a magnetoresistive effect element 1a, an upper electrode 5, a lower electrode 6, a first port 9a into which a high-frequency signal is input, a second port 9b from which a high-frequency signal is output, a first signal line 7a, a second signal line 7b, an inductor 10, a direct-current input terminal 11, and a magnetic-field applying mechanism 12 serving as a frequency setting mechanism. The magnetoresistive effect element 1a includes a magnetization fixed layer 2, a spacer layer 3, and a magnetization free layer 4 in which the direction of magnetization is capable of being varied. The high-frequency signal input into the first port 9a and the high-frequency signal output from the second port 9b are, for example, signals each having a frequency of 100 MHz or higher. The first signal line 7a is connected to the first port 9a and high-frequency current corresponding to the high-frequency signal input into the first port 9a flows through the first signal line 7a. The magnetoresistive effect element 1a is arranged so that a high-frequency magnetic field occurring from the first signal line 7a is applied to the magnetization free layer 4. One end (at the magnetization fixed layer 2 side) of the magnetoresistive effect element 1a is connected to the second port 9b via the lower electrode 6 and the second signal line 7b and the other end (at the magnetization free layer 4 side) of the magnetoresistive effect element 1a may be electrically connected to ground 8 via the upper electrode 5 and a reference potential terminal 30. The inductor 10 is connected to the second signal line 7b in parallel with the second port 9b. The direct-current input terminal 11 is connected to the magnetoresistive effect element 1a so that direct current is capable of being applied to the magnetoresistive effect element 1a. More specifically, the direct-current input terminal 11 is connected between the inductor 10 and the ground 8, as illustrated in FIG. 1. In other words, the direct-current input terminal 11 is connected to the second signal line 7b via the inductor 10 in parallel with the second port 9b and is connected in series to the magnetoresistive effect element 1a and the inductor 10. Connection of a direct-current source 13 to the direct-current input terminal 11 and the ground 8 enables a closed circuit including the magnetoresistive effect element 1a, the second signal line 7b, the direct-current input terminal 11, and the ground 8 to be formed in the magnetoresistive effect device 100. The magnetoresistive effect device 100 does not include a magnetoresistive effect element connected to the second signal line 7b and the ground 8 in parallel with the second port 9b.

The first port 9a is an input port into which a high-frequency signal, which is an alternating current signal, is input. The first signal line 7a is connected to the first port 9a and may be connected to the ground 8 via the reference potential terminal 30. Upon input of a high-frequency signal into the first port 9a, the high-frequency current corresponding to the high-frequency signal input into the first port 9a flows through the first signal line 7a and the high-frequency magnetic field corresponding to the input high-frequency signal occurs from the first signal line 7a. The high-frequency magnetic field occurring from the first signal line 7a is applied to the magnetization free layer 4 and the magnetization of the magnetization free layer 4 oscillates in response to the high-frequency magnetic field occurring from the first signal line 7a. Due to an magnetoresistive effect, upon oscillation of the magnetization of the magnetization free layer 4, the resistance value of the magnetoresistive effect element 1a is varied in response to the input high-frequency signal. The second port 9b is an output port from which a high-frequency signal is output. Upon application of the direct current from the direct-current input terminal 11, the high-frequency signal corresponding to the input high-frequency signal is supplied from the magnetoresistive effect element 1a to the second port 9b as voltage, which is a product of the variable resistance value of the magnetoresistive effect element 1a and the direct current flowing thorough the magnetoresistive effect element 1a.

The upper electrode 5 and the lower electrode 6 serve as a pair of electrodes and are disposed in the stacking direction of the respective layers composing the magnetoresistive effect element 1a with the magnetoresistive effect element 1a interposed therebetween. Specifically, the upper electrode 5 and the lower electrode 6 function as a pair of electrodes to cause the high-frequency current and the direct current to flow through the magnetoresistive effect element 1a in a direction intersecting with the faces of the respective layers composing the magnetoresistive effect element 1a, for example, in a direction (stacking direction) perpendicular to the faces of the respective layers composing the magnetoresistive effect element 1a. Each of the upper electrode 5 and the lower electrode 6 is preferably composed of a film made of Ta, Cu, Au, AuCu, or Ru or a film made of two or more of the above materials.

Figure 2:
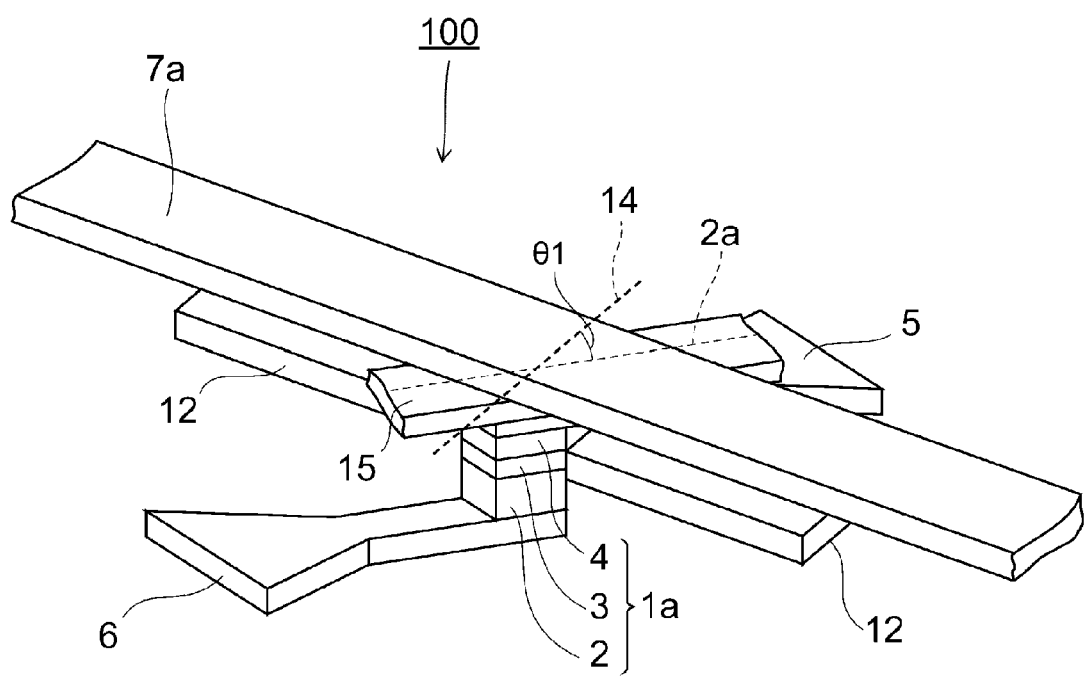
FIG. 2 is a schematic view illustrating an exemplary structure of the magnetoresistive effect device according to the first embodiment.
Figure 3:
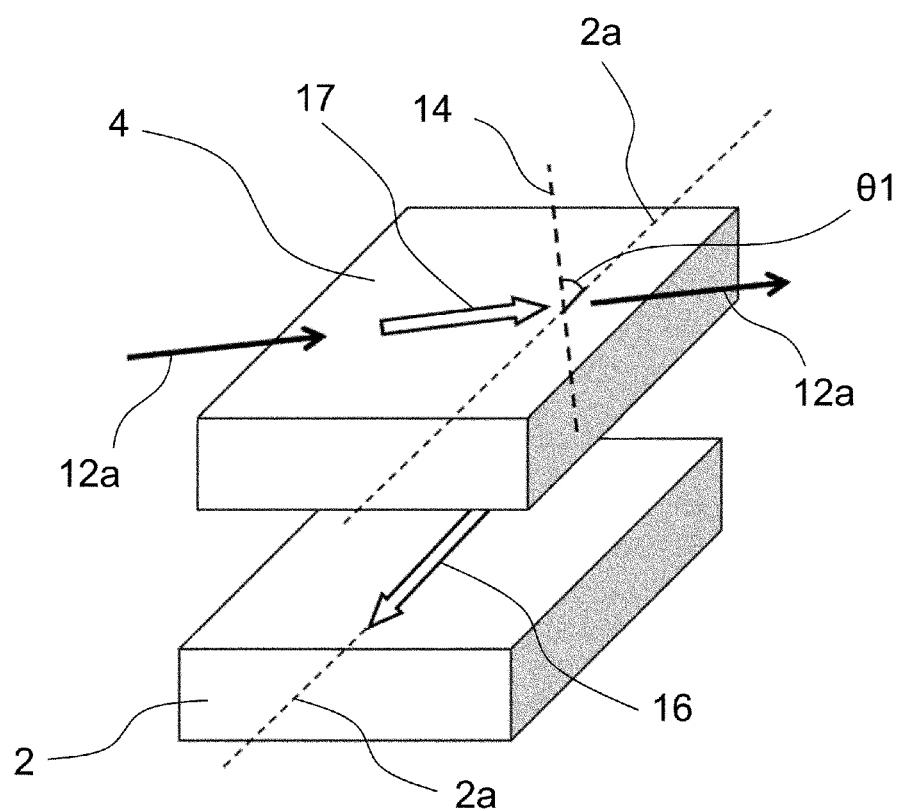
FIG. 3 is a schematic view of a magnetization state of a magnetoresistive effect element when no high-frequency field is applied from a first signal line to the magnetoresistive effect element in the first embodiment.

FIG. 2 is a schematic view illustrating an exemplary structure of the magnetoresistive effect device 100. The magnetoresistive effect device 100 has a structure in which the magnetization fixed layer 2, the spacer layer 3, and the magnetization free layer 4 are stacked in this order and is sandwiched between the upper electrode 5 and the lower electrode 6. An insulator 15 exists between the upper electrode 5 and the first signal line 7a and the first signal line 7a is electrically separated from the upper electrode 5. FIG. 3 is a schematic view of a magnetization state of the magnetoresistive effect element 1a when no high-frequency field is applied from the first signal line 7a to the magnetoresistive effect element 1a. As illustrated in FIG. 2 and FIG. 3, the first signal line 7a is preferably arranged with respect to the magnetoresistive effect element 1a so that an angle θ1 formed by a straight line 2a parallel to the direction of magnetization 16 of the magnetization fixed layer 2 and a straight line 14 parallel to the direction of the high-frequency magnetic field in the magnetization free layer 4, which occurs from the first signal line 7a, is greater than or equal to five degrees and is smaller than or equal to 65 degrees. The angle θ1 is more preferably greater than or equal to 20 degrees and is smaller than or equal to 55 degrees. The magnetic-field applying mechanism 12 is arranged so that a direct-current magnetic field 12a is applied to the magnetization free layer 4 in a direction parallel to the first signal line 7a. When the high-frequency field is not applied from the first signal line 7a, magnetization 17 of the magnetization free layer 4 is directed to the same direction as that of the direct-current magnetic field 12a applied from the magnetic-field applying mechanism 12. The direct-current magnetic field 12a is applied from the magnetic-field applying mechanism 12 so that the direction of the direct-current magnetic field 12a is orthogonal to the straight line 14 parallel to the direction of the high-frequency magnetic field in the magnetization free layer 4.

The ground 8 functions as reference potential. The shape of each of the first signal line 7a, the second signal line 7b, and the ground 8 is preferably defined as a micro strip line (MSL) type or a coplanar waveguide (CPW) type. In design of the micro strip line shape or the coplanar waveguide shape, designing the width of the first signal line 7a or the second signal line 7b and the distance from the first signal line 7a or the second signal line 7b to the ground so that the characteristic impedance of the first signal line 7a or the second signal line 7b is equal to the impedance of a circuit system enables the transmission loss through the first signal line 7a or the second signal line 7b to be reduced. Each of the first signal line 7a and the second signal line 7b is desirably made of a material, such as Au, Cu, AuCu, Ag, or Al, having high electrical conductivity.

The inductor 10 is connected between the second signal line 7b and the ground 8 and has a function to cut off high-frequency components of current with its inductance component and pass direct-current components of the current. The inductor 10 may be a chip inductor or an inductor composed of a pattern line. Alternatively, the inductor 10 may be a resistance element having an inductance component. The inductor 10 preferably has an inductance value of 10 nH or more. The inductor 10 is capable of selectively causing a direct-current signal to flow to the ground 8 without passing the high-frequency signal. The direct current input from the direct-current input terminal 11 flows through a closed circuit including the magnetoresistive effect element 1a, the second signal line 7b, the inductor 10, the direct-current input terminal 11, and the ground 8. This closed circuit enables the direct current to be efficiently applied to the magnetoresistive effect element 1a.

The direct-current input terminal 11 is connected between the inductor 10 and the ground 8. The connection of the direct-current source 13 to the direct-current input terminal 11 enables the direct current to be applied to the magnetoresistive effect element 1a.

The direct-current source 13 is connected to the direct-current input terminal 11 and the ground 8. The direct current is applied from the direct-current input terminal 11 to the closed circuit including the magnetoresistive effect element 1a, the second signal line 7b, the direct-current input terminal 11, and the ground 8. The direct-current source 13 is composed of, for example, a circuit in which a variable resistor is combined with a direct-current voltage source and is capable of varying the current value of the direct current. The direct-current source 13 may be composed of a circuit which is capable of generating constant direct current and in which a fixed resistor is combined with a direct-current voltage source.

The magnetic-field applying mechanism 12 is disposed near the magnetoresistive effect element 1a and is capable of setting a ferromagnetic resonance frequency of the magnetization free layer 4 by applying the direct-current magnetic field 12a to the magnetoresistive effect element 1a. For example, the magnetic-field applying mechanism 12 is of an electromagnetic type or a strip line type capable of variably controlling the strength of the applied magnetic field using voltage or current. Alternatively, the magnetic-field applying mechanism 12 may be a combination of the electromagnetic type or the strip line type with a permanent magnet that applies only a constant magnetic field. The magnetic-field applying mechanism 12 varies an effective magnetic field in the magnetization free layer 4 by varying the magnetic field to be applied to the magnetoresistive effect element 1a to enable the ferromagnetic resonance frequency of the magnetization free layer 4 to be varied.

The magnetization fixed layer 2 is made of a ferromagnetic material and the magnetization direction of the magnetization fixed layer 2 is substantially fixed to one direction. The magnetization fixed layer 2 is preferably made of a material having high spin polarizability, such as Fe, Co, Ni, an alloy of Ni and Fe, an alloy of Fe and Co, or an alloy of Fe, Co, and B. This achieves a high magnetoresistive change rate. The magnetization fixed layer 2 may be made of a Heusler alloy. The magnetization fixed layer 2 preferably has a film thickness of 1 nm to 10 nm. An antiferromagnetic layer may be added so as to be in contact with the magnetization fixed layer 2 in order to fix the magnetization 16 of the magnetization fixed layer 2. Alternatively, the magnetization 16 of the magnetization fixed layer 2 may be fixed using magnetic anisotropy caused by the crystal structure of the magnetization fixed layer 2 or the shape thereof. The antiferromagnetic layer may be made of FeO, CoO, NiO, $CuFeS_2$, IrMn, FeMn, PtMn, Cr, or Mn.

The spacer layer 3 is arranged between the magnetization fixed layer 2 and the magnetization free layer 4. The magnetization 16 of the magnetization fixed layer 2 and the magnetization of the magnetization free layer 4 interact with each other to achieve the magnetoresistive effect. The spacer layer 3 may be formed of a layer made of a conductive material, an insulating material, or a semiconductor material. Alternatively, the spacer layer 3 may be formed of a layer in which a current flow point composed of a conductor is included in an insulator.

When a non-magnetic conductive material is used for the spacer layer 3, the non-magnetic conductive material may be Cu, Ag, Au, or Ru. In this case, a giant magnetoresistance (GMR) effect is produced in the magnetoresistive effect element 1a. When the GMR effect is used, the spacer layer 3 preferably has a film thickness of about 0.5 nm to 3.0 nm.

When a non-magnetic insulating material is used for the spacer layer 3, the non-magnetic insulating material may be $Al_2O_3$ or MgO. In this case, a tunnel magnetoresistance (TMR) effect is produced in the magnetoresistive effect element 1a. Adjusting the film thickness of the spacer layer 3 so that a coherent tunnel effect is produced between the magnetization fixed layer 2 and the magnetization free layer 4 achieves a high magnetoresistive change rate. When the TMR effect is used, the spacer layer 3 preferably has a film thickness of about 0.5 nm to 3.0 nm.

When a non-magnetic semiconductor material is used for the spacer layer 3, the non-magnetic semiconductor material may be ZnO, In$_2$O$_3$, SnO$_2$, ITO, GaO$_x$, or Ga$_2$O$_x$. The spacer layer 3 preferably has a film thickness of about 1.0 nm to 4.0 nm.

When a layer in which the current flow point composed of a conductor is included in a non-magnetic insulator is used as the spacer layer 3, the spacer layer 3 preferably has a structure in which the current flow point composed of a conductor made of, for example, CoFe, CoFeB, CoFeSi, CoMnGe, CoMnSi, CoMnAl, Fe, Co, Au, Cu, Al, or Mg is included in the non-magnetic insulator made of Al$_2$O$_3$ or MgO. In this case, the spacer layer 3 preferably has a film thickness of about 0.5 nm to 2.0 nm.

The direction of the magnetization of the magnetization free layer 4 is capable of being varied with an externally applied magnetic field or spin polarized electrons. The magnetization free layer 4 is made of a ferromagnetic material. When the magnetization free layer 4 is made of a material having a magnetic easy axis in an in-plane direction, the material may be, for example, CoFe, CoFeB, CoFeSi, CoMnGe, CoMnSi, or CoMnAl. The magnetization free layer 4 preferably has a film thickness of about 1 nm to 30 nm. When the magnetization free layer 4 is made of a material having the magnetic easy axis in a plane normal direction, the material may be, for example, Co, a CoCr-based alloy, a Co multilayer film, a CoCrPt-based alloy, an FePt-based alloy, an SmCo-based alloy including rare earth, or a TbFeCo alloy. The magnetization free layer 4 may be made of a Heusler alloy. A material having high spin polarizability may be disposed between the magnetization free layer 4 and the spacer layer 3. This achieves the high magnetoresistive change rate. The material having high spin polarizability may be, for example, a CoFe alloy or a CoFeB alloy. Each of the CoFe alloy and the CoFeB alloy preferably has a film thickness of about 0.2 nm to 1.0 nm.

A cap layer, a seed layer, or a buffer layer may be provided between the upper electrode 5 and the magnetoresistive effect element 1a and between the lower electrode 6 and the magnetoresistive effect element 1a. Each of the cap layer, the seed layer, and the buffer layer may be made of Ru, Ta, Cu, or Cr or may be formed of a stacked film including a Ru layer, a Ta layer, a Cu layer, and a Cr layer. The cap layer, the seed layer, and the buffer layer preferably each have a film thickness of about 2 nm to 10 nm.

The magnetoresistive effect element 1a desirably has long sides of about 100 nm or 100 nm or less. When the magnetoresistive effect element 1a does not have a rectangular shape (including a square shape) in plan view, the long sides of a rectangle circumscribed around the plan view shape of the magnetoresistive effect element 1a with a minimum area are defined as the long sides of the magnetoresistive effect element 1a. When the long sides of the magnetoresistive effect element 1a are short, for example, about 100 nm, the magnetization of the magnetization free layer 4 is capable of having a single magnetic domain to realize the ferromagnetic resonance phenomenon with high efficiency. The "plan view shape" means the shape of the magnetoresistive effect element when the magnetoresistive effect element is viewed from above a plane perpendicular to the stacking direction of the respective layers composing the magnetoresistive effect element.

The ferromagnetic resonance phenomenon will now be described.

When the high-frequency magnetic field occurring from the first signal line 7a is applied to the magnetization free layer 4, the magnetization of the magnetization free layer 4 greatly oscillates for the high-frequency magnetic field having frequencies near the ferromagnetic resonance frequency of the magnetization free layer 4, in the high-frequency magnetic field occurring from the first signal line 7a. This phenomenon is referred to as the ferromagnetic resonance phenomenon. The ferromagnetic resonance frequency is varied with the effective magnetic field in the magnetization free layer 4. An effective magnetic field H$_{eff}$ in the magnetization free layer 4 is represented by the following equation:

$$H_{eff} = H_E + H_k + H_D + H_{EX}$$

where H$_E$ denotes an external magnetic field to be applied to the magnetization free layer 4, H$_k$ denotes an anisotropy magnetic field in the magnetization free layer 4, H$_D$ denotes a demagnetizing field in the magnetization free layer 4, and H$_{EX}$ denotes an exchange coupling magnetic field in the magnetization free layer 4. The magnetic-field applying mechanism 12 is an effective magnetic field setting mechanism that is capable of setting the effective magnetic field H$_{eff}$ in the magnetization free layer 4 by applying the magnetic field to the magnetoresistive effect element 1a and applying the external magnetic field H$_E$ to the magnetization free layer 4. The magnetic-field applying mechanism 12, which is the effective magnetic field setting mechanism, varies the effective magnetic field in the magnetization free layer 4 by varying the magnetic field to be applied to the magnetoresistive effect element 1a to enable the ferromagnetic resonance frequency of the magnetization free layer 4 to be varied. As described above, varying the magnetic field to be applied to the magnetoresistive effect element 1a varies the ferromagnetic resonance frequency of the magnetization free layer 4 in the magnetoresistive effect element 1a. The ferromagnetic resonance frequency is generally increased with the increasing direct-current magnetic field to be applied to the magnetoresistive effect element (the magnetization free layer 4).

Varying the current density of the direct current to be applied to the magnetoresistive effect element varies the ferromagnetic resonance frequency of the magnetization free layer 4. The ferromagnetic resonance frequency of the magnetization free layer 4 is generally decreased with the increasing current density of the direct current to be applied to the magnetoresistive effect element. Accordingly, the ferromagnetic resonance frequency of the magnetization free layer 4 is capable of being variably controlled by varying the direct-current magnetic field to be applied from the magnetic-field applying mechanism 12 to the magnetoresistive effect element 1a (the magnetization free layer 4) or varying the direct current to be applied from the direct-current input terminal 11 to the magnetoresistive effect element 1a. The current density of the direct current to be applied to the magnetoresistive effect element is preferably smaller than an oscillation threshold current density of the magnetoresistive effect element. The oscillation threshold current density of the magnetoresistive effect element means the current density at a threshold value at which the magnetoresistive effect element oscillates at start of precession of the magnetization of the magnetization free layer in the magnetoresistive effect element at a constant frequency and at a constant amplitude (the output (the resistance value) of the magnetoresistive effect element is varied at a constant frequency and at a constant amplitude) in response to application of the direct current having a current density higher than or equal to the oscillation threshold current density.

The frequency of the high-frequency magnetic field occurring from the first signal line 7a corresponds to the frequency of the high-frequency signal input into the first port 9a. Upon application of the high-frequency magnetic field occurring from the first signal line 7a to the magnetization free layer 4, due to the ferromagnetic resonance effect of the magnetization free layer 4, the magnetization of the magnetization free layer 4 greatly oscillates for high-frequency signals having frequencies near the ferromagnetic resonance frequency of the magnetization free layer 4, among the input high-frequency signals, and the resistance value of the magnetoresistive effect element 1a is greatly varied. Accordingly, the high-frequency signals having frequencies near the ferromagnetic resonance frequency of the magnetization free layer 4 are supplied from the magnetoresistive effect element 1a to the second port 9b with greater strength, compared with the high-frequency signals having other frequencies. In other words, the magnetoresistive effect device 100 is capable of having frequency characteristics as a high-frequency filter that is capable of selectively passing the high-frequency signals having frequencies near the ferromagnetic resonance frequency of the magnetization free layer 4 (the frequencies of a pass band).

Since no high-frequency signal is output from the first port 9a even when a high-frequency signal is supplied from the second port 9b to the first port 9a, the magnetoresistive effect device 100 is also capable of functioning as an isolator.

Figure 4:
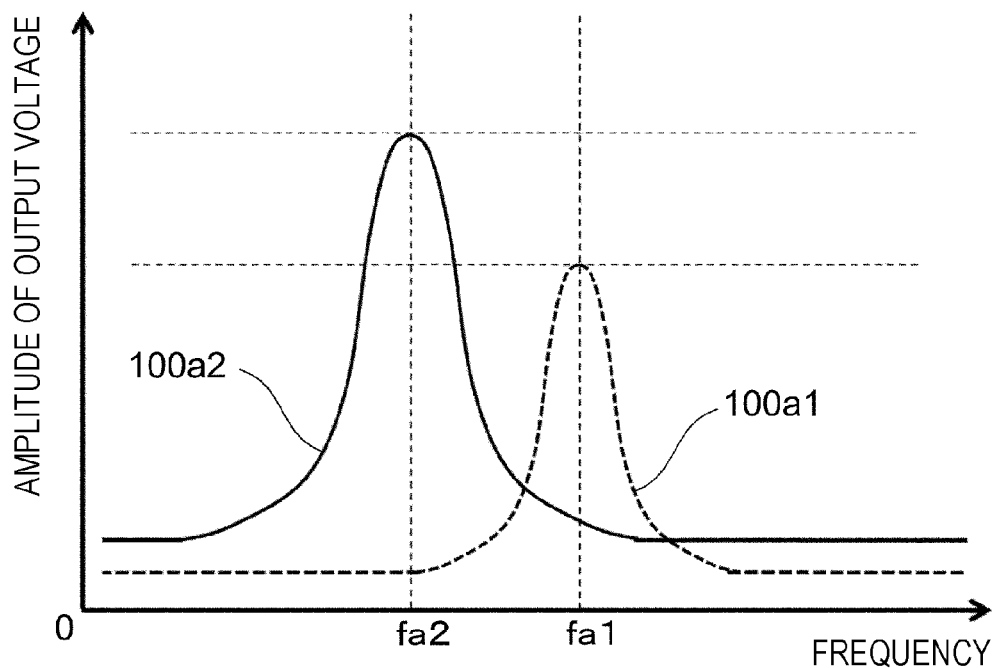
FIG. 4 is a graph illustrating the relationship between frequency and the amplitude of output voltage when direct current is varied in the magnetoresistive effect device according to the first embodiment.
Figure 5:
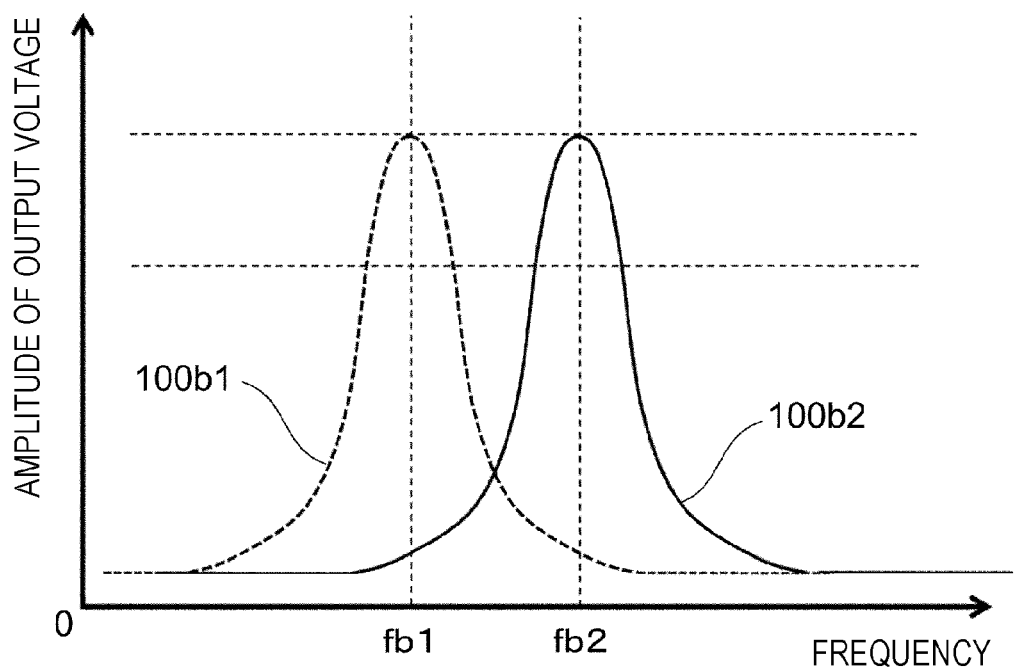
FIG. 5 is a graph illustrating the relationship between frequency and the amplitude of output voltage when the strength of a magnetic field is varied in the magnetoresistive effect device according to the first embodiment.

FIG. 4 and FIG. 5 are graphs each illustrating the relationship between the frequency of a high-frequency signal input into the magnetoresistive effect device 100 and the amplitude of output voltage. Referring to FIG. 4 and FIG. 5, the vertical axis represents the amplitude of output voltage and the horizontal axis represents frequency. FIG. 4 is a graph when the direct-current magnetic field 12a applied to the magnetoresistive effect element 1a is constant. Referring to FIG. 4, a plot line 100a1 represents the relationship between the frequency of the high-frequency signal and the amplitude of the output voltage when the direct current applied from the direct-current input terminal 11 to the magnetoresistive effect element 1a has a value of Ia1 and a plot line 100a2 represents the relationship between the frequency of the high-frequency signal and the amplitude of the output voltage when the direct current applied from the direct-current input terminal 11 to the magnetoresistive effect element 1a has a value of Ia2. The relationship between the direct current values is Ia1<Ia2. FIG. 5 is a graph when constant direct current is applied to the magnetoresistive effect element 1a. Referring to FIG. 5, a plot line 100b1 represents the relationship between the frequency of the high-frequency signal and the amplitude of the output voltage when the direct-current magnetic field 12a applied from the magnetic-field applying mechanism 12 to the magnetoresistive effect element 1a has a strength of Hb1 and a plot line 100b2 represents the relationship between the frequency of the high-frequency signal and the amplitude of the output voltage when the direct-current magnetic field 12a applied from the magnetic-field applying mechanism 12 to the magnetoresistive effect element 1a has a strength of Hb2. The relationship between the strengths of the magnetic fields is Hb1<Hb2.

For example, when the value of the direct current applied from the direct-current input terminal 11 to the magnetoresistive effect element 1a is increased from Ia1 to Ia2, as illustrated in FIG. 4, the amplitude of the output voltage, which is a product of the variable resistance value of the magnetoresistive effect element 1a and the direct current flowing through the magnetoresistive effect element 1a, is increased with the variation in the current value. As a result, the strength of the high-frequency signal output from the second port 9b is increased. In response to the increase of the direct current value from Ia1 to Ia2, the ferromagnetic resonance frequency of the magnetization free layer 4 is shifted from fa1 to fa2. In other words, the passband is shifted toward low frequencies. Thus, the magnetoresistive effect device 100 is capable of functioning as a high-frequency filter capable of varying the frequencies of the passband or an isolator.

When the strength of the direct-current magnetic field 12a applied from the magnetic-field applying mechanism 12 is increased from Hb1 to Hb2, as illustrated in FIG. 5, the ferromagnetic resonance frequency of the magnetization free layer 4 is shifted from fb1 to fb2. In other words, the passband is shifted toward high frequencies. The passband is capable of being greatly shifted when the strength of the direct-current magnetic field 12a (the effective magnetic field $H_{eff}$ in the magnetization free layer 4) is varied, compared with a case in which the direct current value is varied. In other words, the magnetoresistive effect device 100 is capable of functioning as a high-frequency filter capable of varying the frequencies of the passband or an isolator.

When the passband is varied, the phase of a passing signal is varied when attention is focused on a certain frequency in the passband. In other words, the magnetoresistive effect device 100 is also capable of functioning as a phase shifter capable of varying the phase of a signal having a frequency in the passband (operating band).

When the value of the direct current supplied from the direct-current input terminal 11 is higher than or equal to a certain value, the input voltage of the high-frequency signal input into the first port 9a is capable of being made higher than the output voltage output from the second port 9b at frequencies near the ferromagnetic resonance frequency of the magnetization free layer 4. In other words, the magnetoresistive effect device 100 is capable of functioning as an amplifier.

The amplitude of the variable resistance value of the magnetoresistive effect element 1a is decreased with the increasing direct-current external magnetic field $H_E$ to be applied to the magnetoresistive effect element 1a (the increasing effective magnetic field $H_{eff}$ in the magnetization free layer 4). Accordingly, the current density of the direct current to be applied to the magnetoresistive effect element 1a is preferably increased with the increasing direct-current external magnetic field $H_E$ to be applied to the magnetoresistive effect element 1a (the increasing effective magnetic field $H_{eff}$ in the magnetization free layer 4).

In order to increase the range of cut-off characteristics and bandpass characteristics as the high-frequency filter, the magnetoresistive effect element 1a preferably has a configuration in which the magnetization free layer 4 has the magnetic easy axis in the plane normal direction and the magnetization fixed layer 2 has the magnetic easy axis in the in plane direction.

Figure 6:
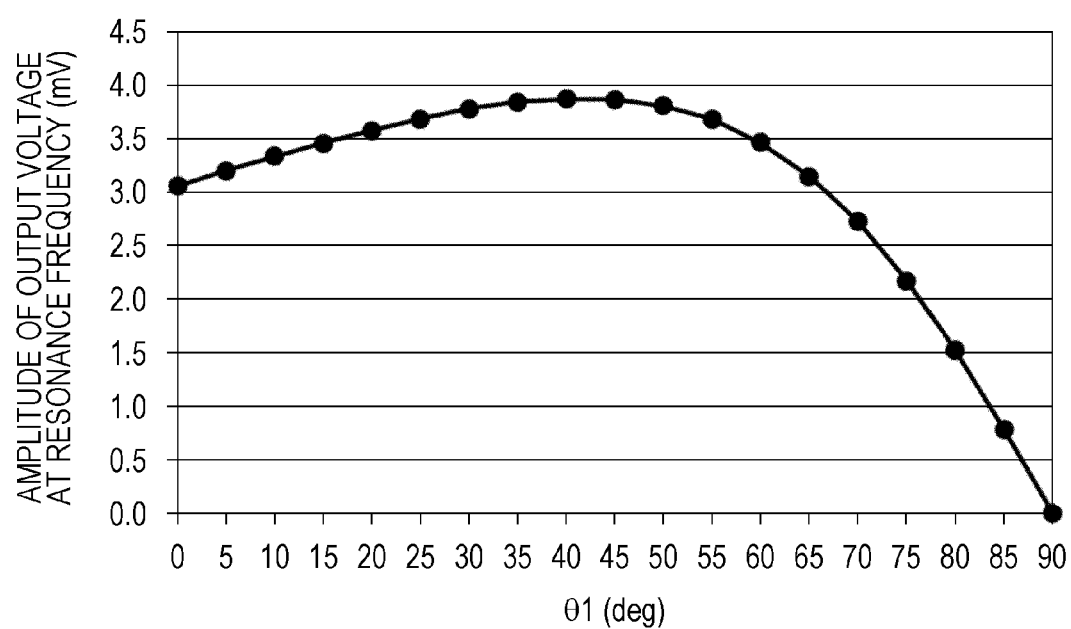
FIG. 6 is a graph illustrating the relationship between an angle ($\theta$1) and the amplitude of output voltage at a ferromagnetic resonance frequency in the magnetoresistive effect device according to the first embodiment.

FIG. 6 is a graph illustrating the relationship between the angle θ1 formed by the straight line 2a parallel to the magnetization 16 of the magnetization fixed layer 2 and the straight line 14 parallel to the direction of the high-frequency magnetic field in the magnetization free layer 4, occurring from the first signal line 7a, and the amplitude of the output voltage at the ferromagnetic resonance frequency of the magnetization free layer 4 in the magnetoresistive effect device 100. Referring to FIG. 6, the vertical axis represents amplitude of output voltage and the horizontal axis represents the angle θ1. It is assumed here that the high-frequency signal of 5 mV is input into the first port 9a. As illustrated in FIG. 6, when the high-frequency signal of the same magnitude is input into the first port 9a, the amplitude of the output voltage is capable of being increased with the angle θ1 being set to a value higher than or equal to five degrees and lower than or equal to 65 degrees and the amplitude of the output voltage is capable of being further increased with the angle θ1 being set to a value higher than or equal to 20 degrees and lower than or equal to 55 degrees.

Figure 7:
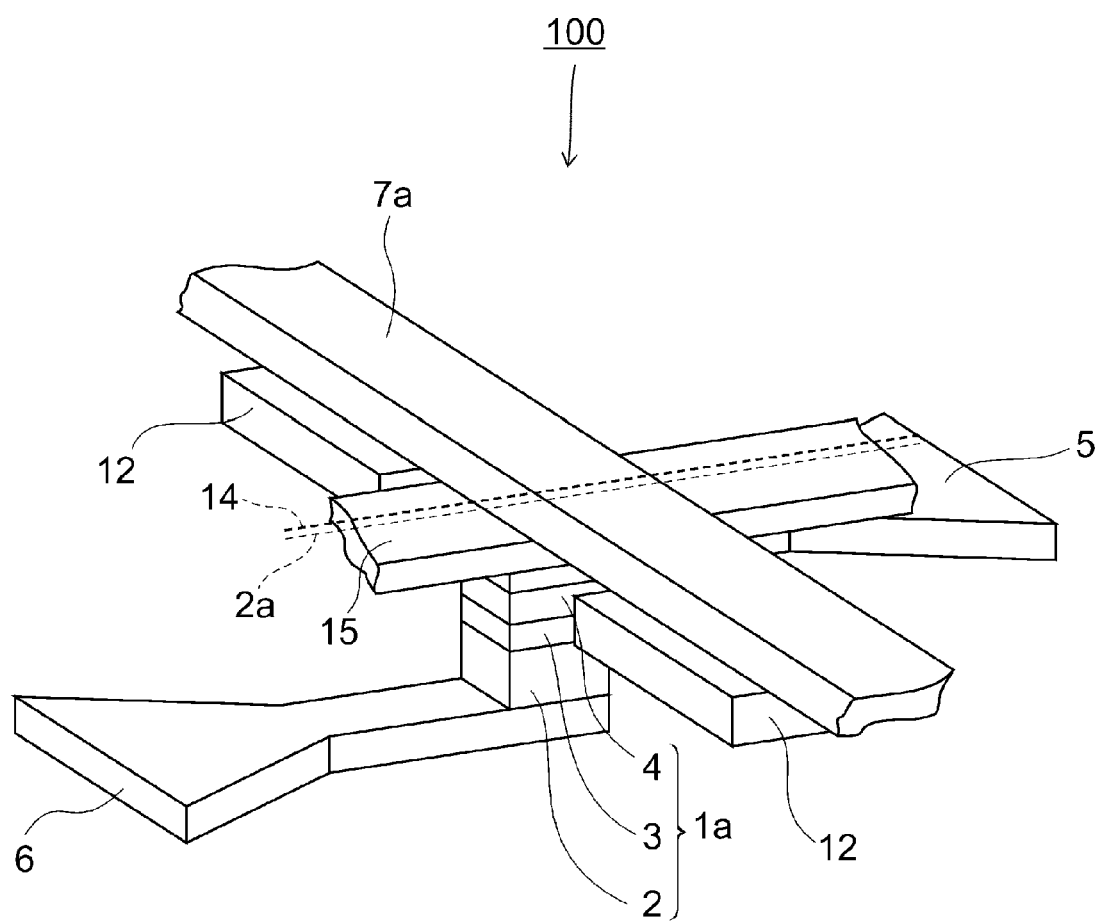
FIG. 7 is a schematic view illustrating an exemplary structure when the angle ($\theta$1) is set to zero in the magnetoresistive effect device according to the first embodiment.
Figure 8:
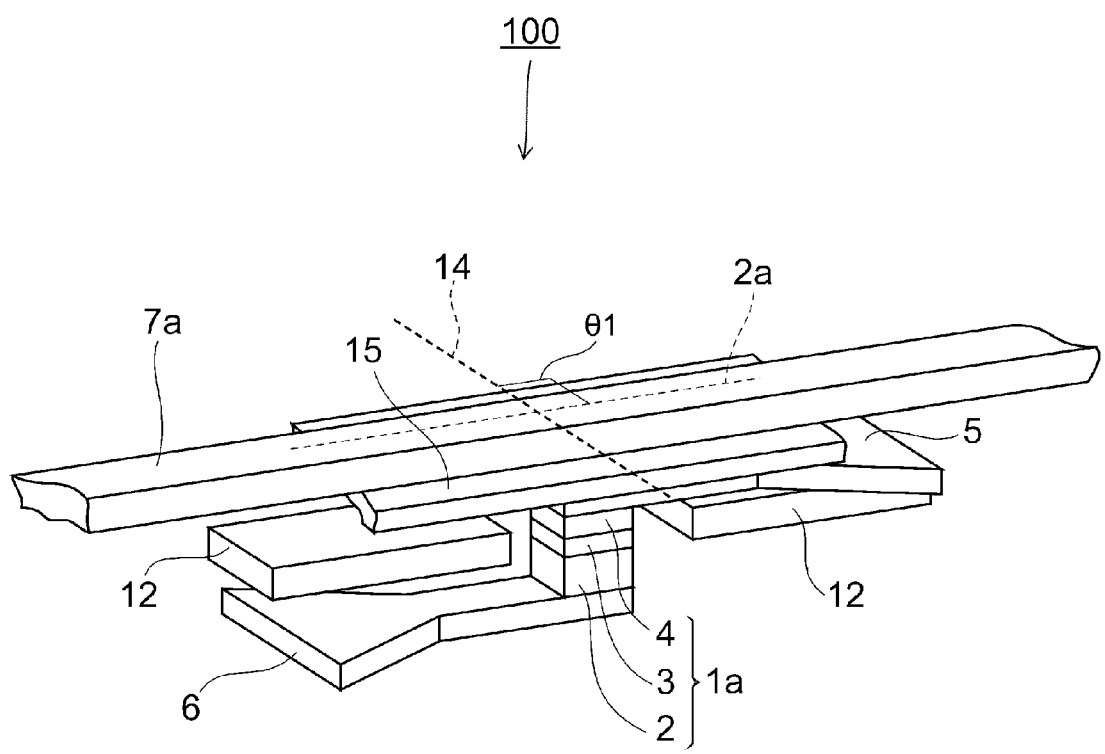
FIG. 8 is a schematic view illustrating an exemplary structure when the angle ($\theta$1) is set to 90 degrees in the magnetoresistive effect device according to the first embodiment.

FIG. 7 is a schematic view when the angle θ1 of the magnetoresistive effect device 100 according to the first embodiment is set to zero. FIG. 8 is a schematic view when the angle θ1 of the magnetoresistive effect device 100 according to the first embodiment is set to 90 degrees.

As described above, the magnetoresistive effect device 100 includes the magnetoresistive effect element 1a including the magnetization fixed layer 2, the spacer layer 3, and the magnetization free layer 4 the direction of magnetization of which is capable of being varied; the first port 9a into which a high-frequency signal is input; the second port 9b from which a high-frequency signal is output; the first signal line 7a; the second signal line 7b; and the direct-current input terminal 11. The first signal line 7a is connected to the first port 9a, high-frequency current corresponding to the high-frequency signal input into the first port 9a flows through the first signal line 7a, and a high-frequency magnetic field occurring from the first signal line 7a is applied to the magnetization free layer 4. The magnetoresistive effect element 1a is connected to the second port 9b via the second signal line 7b, and the direct-current input terminal 11 is connected to the magnetoresistive effect element 1a.

With the above configuration, upon input of a high-frequency signal into the first port 9a, high-frequency current flows through the first signal line 7a. Accordingly, a high-frequency magnetic field corresponding to the input high-frequency signal, occurring from the first signal line 7a, is applied from the first signal line 7a to the magnetization free layer 4 and the magnetization of the magnetization free layer 4 oscillates in response to the high-frequency magnetic field occurring from the first signal line 7a. Due to the magnetoresistive effect, upon oscillation of the magnetization of the magnetization free layer 4, the resistance value of the magnetoresistive effect element 1a is varied with the input high-frequency signal. Upon application of the direct current from the direct-current input terminal 11, the high-frequency signal corresponding to the input high-frequency signal is supplied from the magnetoresistive effect element 1a to the second port 9b as voltage, which is a product of the variable resistance value of the magnetoresistive effect element 1a and the direct current flowing thorough the magnetoresistive effect element 1a. Due to the ferromagnetic resonance effect of the magnetization free layer 4, the magnetization of the magnetization free layer 4 greatly oscillates for high-frequency signals having frequencies near the ferromagnetic resonance frequency of the magnetization free layer 4, among the input high-frequency signals. Accordingly, the high-frequency signals having frequencies near the ferromagnetic resonance frequency of the magnetization free layer 4 are supplied from the magnetoresistive effect element 1a to the second port 9b with greater strength, compared with the high-frequency signals having other frequencies. In other words, the magnetoresistive effect device 100 is capable of having frequency characteristics as a high-frequency filter that is capable of selectively passing the high-frequency signals having frequencies near the ferromagnetic resonance frequency of the magnetization free layer 4.

Since no high-frequency signal is output from the first port 9a even when a high-frequency signal is supplied from the second port 9b to the first port 9a, the magnetoresistive effect device 100 is also capable of functioning as an isolator.

Since varying the direct current applied from the direct-current input terminal 11 enables the ferromagnetic resonance frequency of the magnetization free layer 4 to be variably controlled, the magnetoresistive effect device 100 is also capable of functioning as a variable frequency filter or an isolator. In addition, the magnetoresistive effect device 100 is also capable of functioning as a phase shifter capable of varying the phase of a signal or an amplifier capable of amplification of a signal.

Since the magnetoresistive effect device 100 includes the magnetic-field applying mechanism 12 functioning as the frequency setting mechanism capable of setting the ferromagnetic resonance frequency of the magnetization free layer 4, the ferromagnetic resonance frequency of the magnetization free layer 4 is capable of being set to an arbitrary frequency. Accordingly, the magnetoresistive effect device 100 is capable of functioning as, for example, a filter for an arbitrary frequency band or an isolator.

Since the magnetic-field applying mechanism 12 functions as the effective magnetic field setting mechanism capable of setting the effective magnetic field in the magnetization free layer 4 and is capable of varying the ferromagnetic resonance frequency of the magnetization free layer 4 by varying the effective magnetic field in the magnetization free layer 4, the magnetoresistive effect device 100 is capable of functioning as a variable frequency filter or an isolator. In addition, the magnetoresistive effect device 100 is also capable of functioning as a phase shifter capable of varying the phase of a signal or an amplifier capable of amplification of a signal.

Since the magnetoresistive effect device 100 does not include a magnetoresistive effect element connected to the second signal line 7b and the ground 8 in parallel with the second port 9b, the high-frequency signal does not flow into the magnetoresistive effect element connected to the second signal line 7b and the ground 8 in parallel with the second port 9b and the magnetoresistive effect device 100 is capable of preventing the loss of the high-frequency signal from being increased.

Various components may be added to the magnetoresistive effect device 100 of the first embodiment described above. For example, in order to prevent the direct current signal from flowing into a high-frequency circuit connected to the first port 9a, a capacitor for cutting off the direct current signal may be connected in series to the second signal line 7b between a connection port of the direct-current input terminal 11 (or the inductor 10) to the second signal line 7b and the second port 9b.

Second Embodiment

Figure 9:
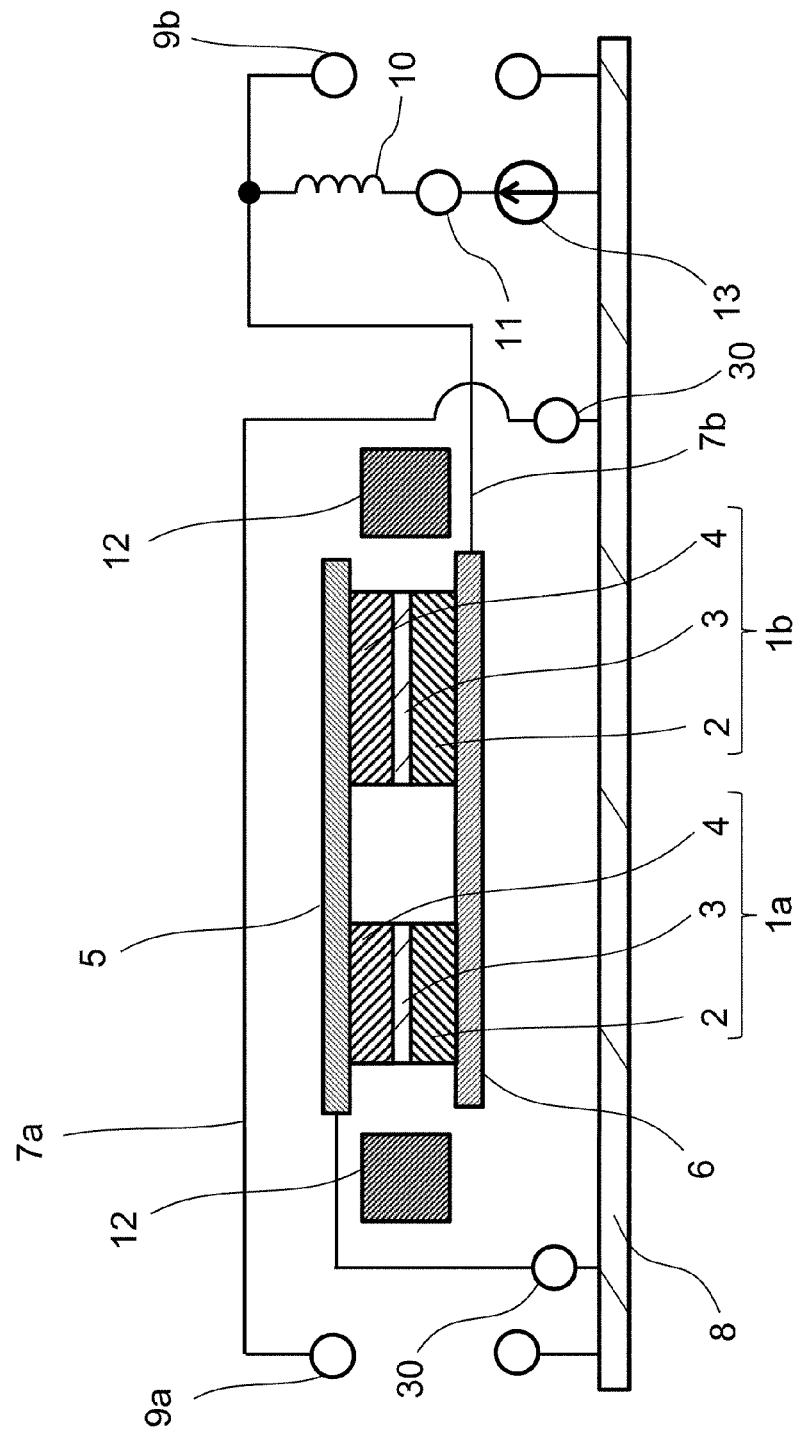
FIG. 9 is a schematic cross-sectional view illustrating an exemplary configuration of a magnetoresistive effect device according to a second embodiment.

FIG. 9 is a schematic cross-sectional view of a magnetoresistive effect device 101 according to a second embodiment of the present invention. Points different from the magnetoresistive effect device 100 of the first embodiment in the magnetoresistive effect device 101 will be mainly described and a description of common points will be appropriately omitted herein. The same reference numerals are used in the second embodiment to identify the same components in the magnetoresistive effect device 100 of the first embodiment and a description of the common components will be omitted herein. The magnetoresistive effect device 101 includes two magnetoresistive effect elements 1a and 1b each including the magnetization fixed layer 2, the spacer layer 3, and the magnetization free layer 4, the upper electrode 5, the lower electrode 6, the first port 9a, the second port 9b, the first signal line 7a, the second signal line 7b, the inductor 10, the direct-current input terminal 11, and the magnetic-field applying mechanism 12 serving as the frequency setting mechanism. The magnetoresistive effect elements 1a and 1b are arranged so that the high-frequency magnetic field occurring from the first signal line 7a is applied to the magnetization free layers 4 in the magnetoresistive effect elements 1a and 1b. The magnetoresistive effect element 1a is connected in parallel to the magnetoresistive effect element 1b between the upper electrode 5 and the lower electrode 6, the magnetization free layer 4 in the magnetoresistive effect element 1a and the magnetization free layer 4 in the magnetoresistive effect element 1b are connected to the same upper electrode 5, and the magnetization fixed layer 2 in the magnetoresistive effect element 1a and the magnetization fixed layer 2 in the magnetoresistive effect element 1b are connected to the same lower electrode 6. One end (at the magnetization fixed layer 2 side) of each of the magnetoresistive effect elements 1a and 1b is connected to the second port 9b via the lower electrode 6 and the second signal line 7b and the other end (at the magnetization free layer 4 side) of each of the magnetoresistive effect elements 1a and 1b may be electrically connected to the ground 8 via the upper electrode 5 and the reference potential terminal 30.

The magnetoresistive effect element 1a differs from the magnetoresistive effect element 1b in their ferromagnetic resonance frequencies of the magnetization free layers 4 in a state in which the same direct-current magnetic field 12a and the direct current having the same current density are applied to the magnetoresistive effect elements 1a and 1b. More specifically, although the magnetoresistive effect elements 1a and 1b have the same film structure and each have a rectangular shape in plan view, the plan view shape of the magnetoresistive effect element 1a is different from the plan view shape of the magnetoresistive effect element 1b in the aspect ratio. "The same film structure" means that the magnetoresistive effect elements 1a and 1b have the same material and the same film thickness of each layer composing the magnetoresistive effect elements and have the same stacking order of the layers. "The plan view shape" means the shape of each of the magnetoresistive effect elements when the magnetoresistive effect element is viewed from above a plane perpendicular to the stacking direction of the respective layers composing the magnetoresistive effect element. "The aspect ratio" means the ratio of the length of long sides to the length of short sides of a rectangle circumscribed around the plan view shape of the magnetoresistive effect element with a minimum area.

The inductor 10 is connected between the second signal line 7b and the ground 8. The direct-current input terminal 11 is connected in series to the magnetoresistive effect elements 1a and 1b, which are connected in parallel to each other, and the inductor 10 and is connected to the second signal line 7b via the inductor 10 in parallel with the second port 9b. Connection of the direct-current source 13 to the direct-current input terminal 11 and the ground 8 enables a closed circuit including the magnetoresistive effect element 1a, the magnetoresistive effect element 1b, the second signal line 7b, the direct-current input terminal 11, and the ground 8 to be formed in the magnetoresistive effect device 101. The direct current supplied from the direct-current input terminal 11 flows through the closed circuit and is supplied to the magnetoresistive effect element 1a and the magnetoresistive effect element 1b.

The magnetic-field applying mechanism 12 is disposed near the magnetoresistive effect elements 1a and 1b and simultaneously applies the same direct-current magnetic field 12a to the magnetoresistive effect elements 1a and 1b to set the ferromagnetic resonance frequency of the magnetization free layer 4 in each of the magnetoresistive effect elements 1a and 1b. The magnetic-field applying mechanism 12 varies the effective magnetic field in the magnetization free layer 4 in each of the magnetoresistive effect elements 1a and 1b by varying the magnetic fields to be applied to the magnetoresistive effect elements 1a and 1b to enable the ferromagnetic resonance frequency of the magnetization free layer 4 in each of the magnetoresistive effect elements 1a and 1b to be varied.

Figure 10:
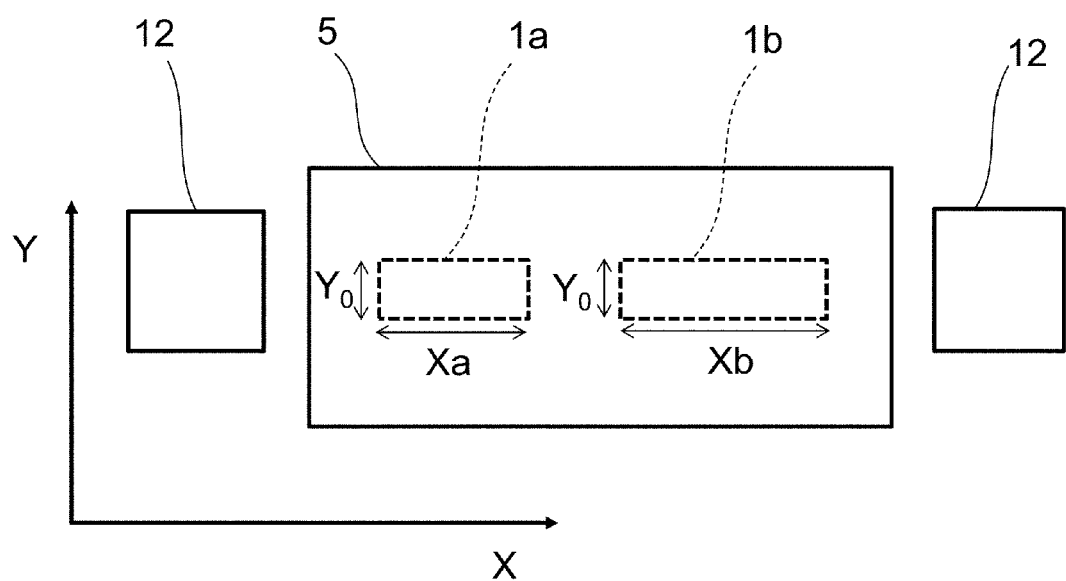
FIG. 10 is a top view of the magnetoresistive effect device according to the second embodiment.

The film structures of the magnetoresistive effect elements 1a and 1b are the same as the film structure of the magnetoresistive effect element 1a of the first embodiment. FIG. 10 is a top view of the magnetoresistive effect device 101. As illustrated in FIG. 10, the magnetoresistive effect elements 1a and 1b have the same dimension $Y_0$ in the Y direction, which is the direction of the short sides of the plan view shapes of the magnetoresistive effect elements 1a and 1b. However, a dimension Xa in the X direction, which is the direction of the long sides of the plane view shape of the magnetoresistive effect element 1a, is different from a dimension Xb in the X direction, which is the direction of the long sides of the plane view shape of the magnetoresistive effect element 1b, and Xa<Xb. Accordingly, the aspect ratio $(Xb/Y_0)$ of the plan view shape of the magnetoresistive effect element 1b is higher than the aspect ratio $(Xa/Y_0)$ of the plan view shape of the magnetoresistive effect element 1a. In consideration of a state in which the same direct-current magnetic field 12a and the direct current of the same current density are applied to the magnetoresistive effect elements, the ferromagnetic resonance frequency of the magnetization free layer in each of the magnetoresistive effect elements is increased with an increase in aspect ratio of the plan view shape of the magnetoresistive effect element. As a result, a ferromagnetic resonance frequency fb of the magnetization free layer 4 in the magnetoresistive effect element 1b is higher than a ferromagnetic resonance frequency fa of the magnetization free layer 4 in the magnetoresistive effect element 1a. Since differentiating the aspect ratios of the plan view shapes of the multiple magnetoresistive effect elements in the above manner enables the ferromagnetic resonance frequencies of the magnetization free layers to be differentiated from each other even when the magnetoresistive effect elements have the same film structure, it is possible to manufacture the multiple magnetoresistive effect elements differing in their ferromagnetic resonance frequencies of the magnetization free layers through the same film formation process. In other words, since the multiple magnetoresistive effect elements have the same film structure, it is possible to collectively form the films of the layers composing the multiple magnetoresistive effect elements.

The high-frequency magnetic field occurring from the first signal line 7a is simultaneously applied to the magnetization free layers 4 in the magnetoresistive effect elements 1a and 1b and the magnetization of the magnetization free layer 4 in each of the magnetoresistive effect elements 1a and 1b oscillates in response to the high-frequency magnetic field occurring from the first signal line 7a. Due to the magnetoresistive effect, upon oscillation of the magnetization of the magnetization free layers 4, the resistance values of the magnetoresistive effect elements 1a and 1b are varied with the input high-frequency signal. Upon application of the direct current from the direct-current input terminal 11, the high-frequency signal corresponding to the high-frequency signal input into the first port 9a is supplied from the magnetoresistive effect element 1a to the second port 9b as voltage, which is a product of the variable resistance value of the magnetoresistive effect element 1a and the direct current flowing thorough the magnetoresistive effect element 1a. Similarly, upon application of the direct current from the direct-current input terminal 11, the high-frequency signal corresponding to the high-frequency signal input into the first port 9a is supplied from the magnetoresistive effect element 1b to the second port 9b as voltage, which is a product of the variable resistance value of the magnetoresistive effect element 1b and the direct current flowing thorough the magnetoresistive effect element 1b.

The direction of the magnetization 16 of the magnetization fixed layer 2 in the magnetoresistive effect element 1a is the same as the direction of the magnetization 16 of the magnetization fixed layer 2 in the magnetoresistive effect element 1b. The first signal line 7a is preferably arranged with respect to the magnetoresistive effect elements 1a and 1b so that the angle formed by the straight line 2a parallel to the direction of magnetization 16 of the magnetization fixed layer 2 and the straight line 14 parallel to the direction of the high-frequency magnetic field in the magnetization free layer 4, which occurs from the first signal line 7a, is greater than or equal to five degrees and is smaller than or equal to 65 degrees. This angle is more preferably greater than or equal to 20 degrees and is smaller than or equal to 55 degrees. The magnetic-field applying mechanism 12 is arranged so that the direct-current magnetic field 12a is applied to the magnetization free layers 4 in the magnetoresistive effect elements 1a and 1b in the direction parallel to the first signal line 7a.

The frequency of the high-frequency magnetic field occurring from the first signal line 7a corresponds to the frequency of the high-frequency signal input into the first port 9a. Upon application of the high-frequency magnetic field occurring from the first signal line 7a to the magnetization free layers 4 in the magnetoresistive effect elements 1a and 1b, due to the ferromagnetic resonance effect of the magnetization free layers 4 in the magnetoresistive effect elements 1a and 1b, the magnetization of the magnetization free layer 4 greatly oscillates for high-frequency signals having frequencies near the ferromagnetic resonance frequency of the magnetization free layer 4 in the magnetoresistive effect element 1a or the magnetoresistive effect element 1b, among the input high-frequency signals, and the resistance value of the magnetoresistive effect element 1a or the magnetoresistive effect element 1b is greatly varied. Accordingly, the high-frequency signals having frequencies near the ferromagnetic resonance frequency of the magnetization free layer 4 in the magnetoresistive effect element 1a or the magnetoresistive effect element 1b are supplied from the magnetoresistive effect element 1a or the magnetoresistive effect element 1b to the second port 9b with greater strength, compared with the high-frequency signals having other frequencies. In other words, the magnetoresistive effect device 101 is capable of having frequency characteristics as a high-frequency filter that is capable of selectively passing the high-frequency signals having frequencies near the ferromagnetic resonance frequency of the magnetization free layer 4 in the magnetoresistive effect element 1a or the magnetoresistive effect element 1b (the frequencies of the pass band).

As in the magnetoresistive effect device 100 of the first embodiment, the magnetoresistive effect device 101 is also capable of functioning as an isolator.

Figure 11:
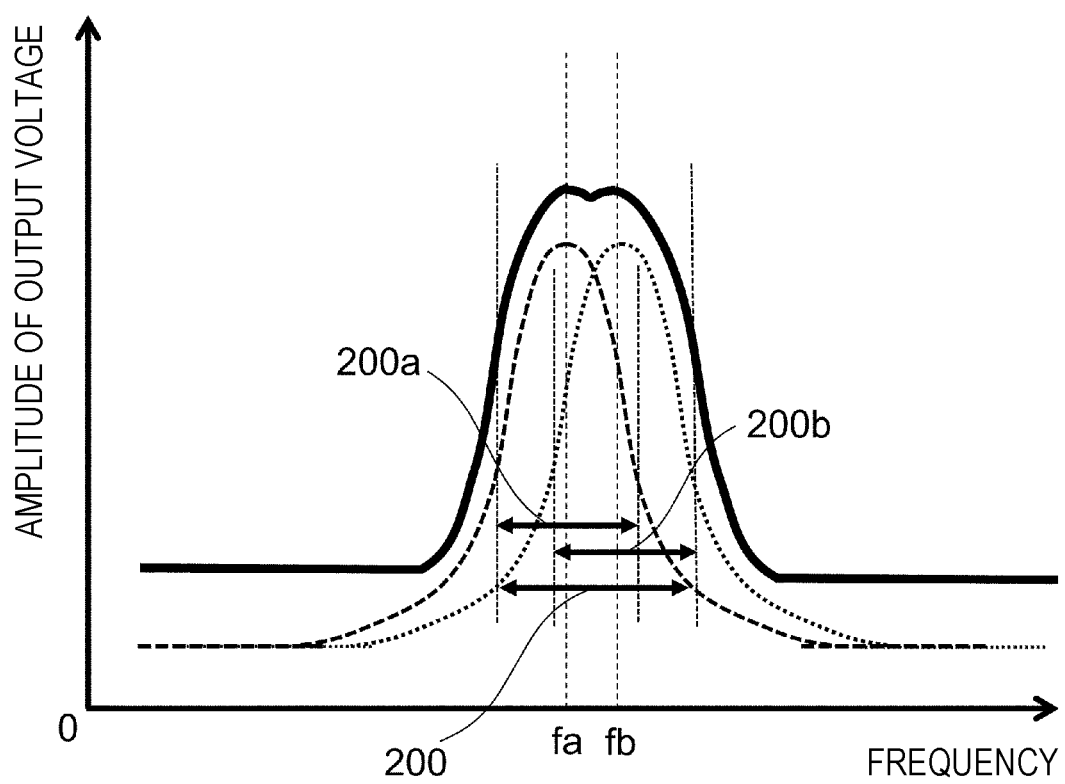
FIG. 11 is a graph illustrating the relationship between frequency and the amplitude of output voltage in the magnetoresistive effect device according to the second embodiment.

FIG. 11 is a graph illustrating the relationship between the frequency of a high-frequency signal input into the magnetoresistive effect device 101 and the amplitude of output voltage. Referring to FIG. 11, the vertical axis represents amplitude of output voltage and the horizontal axis represents frequency. As illustrated in FIG. 11, differentiating the aspect ratios of the plan view shapes of the magnetoresistive effect elements 1a and 1b from each other so that part of the frequencies near the ferromagnetic resonance frequency fa of the magnetization free layer 4 in the magnetoresistive effect element 1a (a passband 200a illustrated in FIG. 11) is overlapped with part of the frequencies near the ferromagnetic resonance frequency fb of the magnetization free layer 4 in the magnetoresistive effect element 1b (a passband 200b illustrated in FIG. 11) allows the magnetoresistive effect device 101 to have a passband (a passband 200 illustrated in FIG. 11) wider than that of the magnetoresistive effect device 100 of the first embodiment, as illustrated in FIG. 11.

Varying the direct current to be applied to the magnetoresistive effect elements 1a and 1b or the strength of the magnetic field to be applied from the magnetic-field applying mechanism 12 to the magnetoresistive effect elements 1a and 1b enables the bandwidth of the magnetoresistive effect device 101 to be arbitrarily varied. Accordingly, the magnetoresistive effect device 101 is capable of functioning as a variable frequency filter capable of arbitrarily varying the passband 200 or an isolator. In addition, as in the magnetoresistive effect device 100 of the first embodiment, the magnetoresistive effect device 101 is also capable of functioning as a phase shifter capable of varying the phase of a signal or an amplifier capable of amplification of a signal. The phase shifter and the isolator use the passband 200 as the operating band.

As described above, the multiple magnetoresistive effect elements 1a and 1b differing in their ferromagnetic resonance frequencies of the magnetization free layers 4 are connected in parallel to each other in the magnetoresistive effect device 101. Accordingly, the high-frequency signals with higher strengths are supplied to the second port 9b near multiple frequencies that are the same as the ferromagnetic resonance frequencies of the magnetization free layers 4 in the respective magnetoresistive effect elements and the passband 200 having a certain width is provided. In addition, varying the direct current or the magnetic field to be applied to the magnetoresistive effect elements enables the position of the passband 200 to be varied. In other words, the magnetoresistive effect device 101 is capable of functioning as a variable frequency filter capable of varying the position of the passband 200 or an isolator. In addition, the magnetoresistive effect device 101 is also capable of functioning as a phase shifter or an amplifier, which use the passband 200 as the operating band.

Since the plan view shapes of the multiple magnetoresistive effect elements 1a and 1b have different aspect ratios from each other in the magnetoresistive effect device 101, it is possible to manufacture the multiple magnetoresistive effect elements 1a and 1b differing in their ferromagnetic resonance frequencies of the magnetization free layers 4 through the same process. Specifically, since the multiple magnetoresistive effect elements 1a and 1b have the same film structure in the magnetoresistive effect device 101, it is possible to collectively form the films of the layers composing the multiple magnetoresistive effect elements 1a and 1b.

Although the two magnetoresistive effect elements 1a and 1b differing in their ferromagnetic resonance frequencies of the magnetization free layers 4 are connected in parallel to each other in the magnetoresistive effect device 101 of the second embodiment, three or more magnetoresistive effect elements differing in their ferromagnetic resonance frequencies of the magnetization free layers 4 may be connected in parallel to each other. In this case, it is possible to further increase the width of the passband.

Although the two magnetoresistive effect elements 1a and 1b have the same film structure in the magnetoresistive effect device 101 of the second embodiment, the multiple magnetoresistive effect elements may have different film structures. In this case, the different film structures may be used while the aspect ratios of the plane view shapes of the multiple magnetoresistive effect elements are made equal to each other to differentiate the ferromagnetic resonance frequencies of the magnetization free layers in the multiple magnetoresistive effect elements from each other.

Although the same magnetic field is simultaneously applied from the magnetic-field applying mechanism 12 to the magnetoresistive effect elements 1a and 1b in the magnetoresistive effect device 101 of the second embodiment, the magnetoresistive effect device 101 may include magnetic-field applying mechanisms for individually applying the magnetic fields to the respective magnetoresistive effect elements.

Third Embodiment

Figure 12:
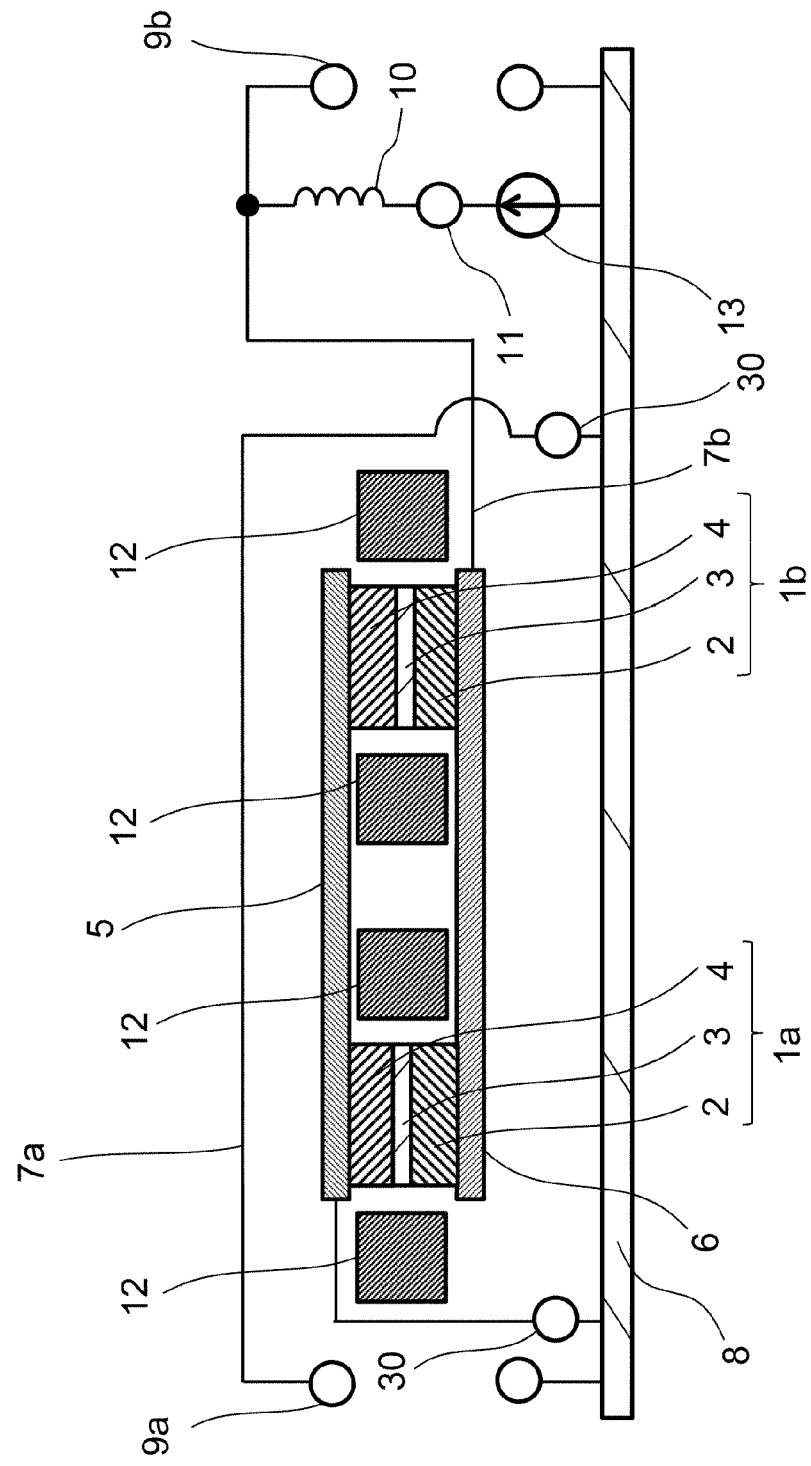
FIG. 12 is a schematic cross-sectional view illustrating an exemplary configuration of a magnetoresistive effect device according to a third embodiment.

FIG. 12 is a schematic cross-sectional view of a magnetoresistive effect device 102 according to a third embodiment of the present invention. Points different from the magnetoresistive effect device 100 of the first embodiment in the magnetoresistive effect device 102 will be mainly described and a description of common points will be appropriately omitted herein. The same reference numerals are used in the third embodiment to identify the same components in the magnetoresistive effect device 100 of the first embodiment and a description of the common components will be omitted herein. The magnetoresistive effect device 102 includes the two magnetoresistive effect elements 1a and 1b each including the magnetization fixed layer 2, the spacer layer 3, and the magnetization free layer 4, the upper electrode 5, the lower electrode 6, the first port 9a, the second port 9b, the first signal line 7a, the second signal line 7b, the inductor 10, the direct-current input terminal 11, and two magnetic-field applying mechanisms 12 serving as two frequency setting mechanisms. The magnetoresistive effect elements 1a and 1b are arranged so that the high-frequency magnetic field occurring from the first signal line 7a is applied to the magnetization free layers 4 in the magnetoresistive effect elements 1a and 1b. The two magnetoresistive effect elements 1a and 1b have the same configuration and the magnetoresistive effect element 1a is connected in parallel to the magnetoresistive effect element 1b between the upper electrode 5 and the lower electrode 6. The magnetization free layer 4 in the magnetoresistive effect element 1a and the magnetization free layer 4 in the magnetoresistive effect element 1b are connected to the same upper electrode 5, and the magnetization fixed layer 2 in the magnetoresistive effect element 1a and the magnetization fixed layer 2 in the magnetoresistive effect element 1b are connected to the same lower electrode 6. One end (at the magnetization fixed layer 2 side) of each of the magnetoresistive effect elements 1a and 1b is connected to the second port 9b via the lower electrode 6 and the second signal line 7b and the other end (at the magnetization free layer 4 side) of each of the magnetoresistive effect elements 1a and 1b may be electrically connected to the ground 8 via the upper electrode 5 and the reference potential terminal 30. The magnetic-field applying mechanisms 12 apply the individual direct-current magnetic fields 12a to the two respective magnetoresistive effect elements 1a and 1b. As described above, the magnetoresistive effect device 102 includes the two magnetic-field applying mechanisms 12 serving as the frequency setting mechanisms so that the ferromagnetic resonance frequencies of the respective magnetization free layers 4 in the two magnetoresistive effect elements 1a and 1b are capable of being individually set.

The inductor 10 is connected between the second signal line 7b and the ground 8. The direct-current input terminal 11 is connected in series to the magnetoresistive effect elements 1a and 1b, which are connected in parallel to each other, and the inductor 10 and is connected to the second signal line 7b via the inductor 10 in parallel with the second port 9b. Connection of the direct-current source 13 to the direct-current input terminal 11 and the ground 8 enables a closed circuit including the magnetoresistive effect element 1a, the magnetoresistive effect element 1b, the second signal line 7b, the direct-current input terminal 11, and the ground 8 to be formed in the magnetoresistive effect device 102. The direct current supplied from the direct-current input terminal 11 flows through the closed circuit and is supplied to the magnetoresistive effect element 1a and the magnetoresistive effect element 1b.

In the magnetoresistive effect device 102, the high-frequency magnetic field occurring from the first signal line 7a is simultaneously applied to the magnetization free layers 4 in the two magnetoresistive effect elements 1a and 1b in a state in which the direct-current magnetic fields 12a are individually applied from the respective magnetic-field applying mechanisms 12 to the corresponding magnetoresistive effect elements 1a and 1b. For example, the strength of the direct-current magnetic field 12a to be applied to the magnetoresistive effect element 1a is made smaller than the strength of the direct-current magnetic field 12a to be applied to the magnetoresistive effect element 1b. In this case, the ferromagnetic resonance frequency of the magnetization free layer 4 in the magnetoresistive effect element 1a is lower than the ferromagnetic resonance frequency of the magnetization free layer 4 in the magnetoresistive effect element 1b.

The high-frequency magnetic field occurring from the first signal line 7a is simultaneously applied to the magnetization free layers 4 in the magnetoresistive effect elements 1a and 1b and the magnetization of the magnetization free layer 4 in each of the magnetoresistive effect elements 1a and 1b oscillates in response to the high-frequency magnetic field occurring from the first signal line 7a. Due to the magnetoresistive effect, upon oscillation of the magnetization of the magnetization free layers 4, the resistance values of the magnetoresistive effect elements 1a and 1b are varied with the input high-frequency signal. Upon application of the direct current from the direct-current input terminal 11, the high-frequency signal corresponding to the high-frequency signal input into the first port 9a is supplied from the magnetoresistive effect element 1a to the second port 9b as voltage, which is a product of the variable resistance value of the magnetoresistive effect element 1a and the direct current flowing thorough the magnetoresistive effect element 1a. Similarly, upon application of the direct current from the direct-current input terminal 11, the high-frequency signal corresponding to the high-frequency signal input into the first port 9a is supplied from the magnetoresistive effect element 1b to the second port 9b as voltage, which is a product of the variable resistance value of the magnetoresistive effect element 1b and the direct current flowing thorough the magnetoresistive effect element 1b.

The direction of the magnetization 16 of the magnetization fixed layer 2 in the magnetoresistive effect element 1a is the same as the direction of the magnetization 16 of the magnetization fixed layer 2 in the magnetoresistive effect element 1b. The first signal line 7a is preferably arranged with respect to the magnetoresistive effect elements 1a and 1b so that the angle formed by the straight line 2a parallel to the direction of magnetization 16 of the magnetization fixed layer 2 and the straight line 14 parallel to the direction of the high-frequency magnetic field in the magnetization free layer 4, which occurs from the first signal line 7a, is greater than or equal to five degrees and is smaller than or equal to 65 degrees. This angle is more preferably greater than or equal to 20 degrees and is smaller than or equal to 55 degrees. The respective magnetic-field applying mechanisms 12 are arranged so that the direct-current magnetic fields 12a are applied to the magnetization free layers 4 in the magnetoresistive effect elements 1a and 1b in the direction parallel to the first signal line 7a.

The frequency of the high-frequency magnetic field occurring from the first signal line 7a corresponds to the frequency of the high-frequency signal input into the first port 9a. Upon application of the high-frequency magnetic field occurring from the first signal line 7a to the magnetization free layers 4 in the magnetoresistive effect elements 1a and 1b in the state in which the direct-current magnetic fields 12a are individually applied from the respective magnetic-field applying mechanisms 12 to the corresponding magnetoresistive effect elements 1a and 1b, due to the ferromagnetic resonance effect of the magnetization free layers 4 in the magnetoresistive effect elements 1a and 1b, the magnetization of the magnetization free layer 4 greatly oscillates for high-frequency signals having frequencies near the ferromagnetic resonance frequency of the magnetization free layer 4 in the magnetoresistive effect element 1a or the magnetoresistive effect element 1b, among the input high-frequency signals, and the resistance value of the magnetoresistive effect element 1a or the magnetoresistive effect element 1b is greatly varied. Accordingly, the high-frequency signals having frequencies near the ferromagnetic resonance frequency of the magnetization free layer 4 in the magnetoresistive effect element 1a or the magnetoresistive effect element 1b are supplied from the magnetoresistive effect element 1a or the magnetoresistive effect element 1b to the second port 9b with greater strength, compared with the high-frequency signals having other frequencies. In other words, the magnetoresistive effect device 102 is capable of having frequency characteristics as a high-frequency filter that is capable of selectively passing the high-frequency signals having frequencies near the ferromagnetic resonance frequency of the magnetization free layer 4 in the magnetoresistive effect element 1a or the magnetoresistive effect element 1b (the frequencies of the pass band).

As in the magnetoresistive effect device 100 of the first embodiment, the magnetoresistive effect device 102 is also capable of functioning as an isolator.

Figure 13:
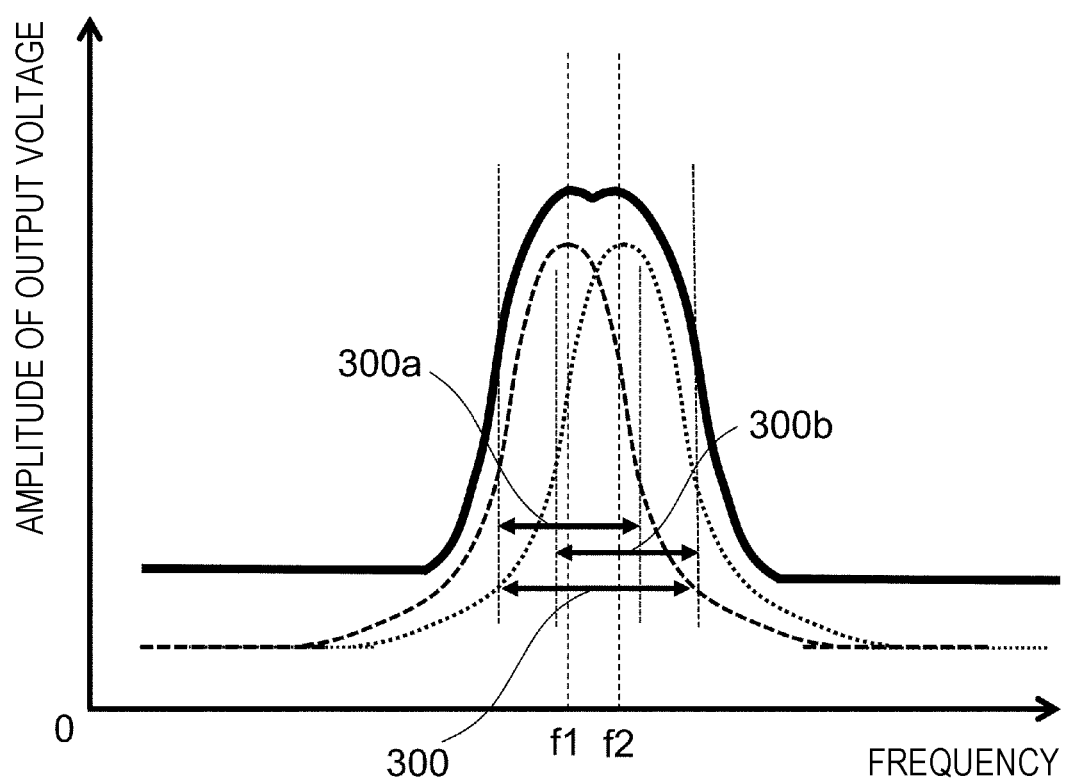
FIG. 13 is a graph illustrating the relationship between frequency and the amplitude of output voltage in the magnetoresistive effect device according to the third embodiment.

FIG. 13 is a graph illustrating the relationship between the frequency of a high-frequency signal input into the magnetoresistive effect device 102 and the amplitude of output voltage. Referring to FIG. 13, the vertical axis represents amplitude of output voltage and the horizontal axis represents frequency. For example, as illustrated in FIG. 13, when the magnetic field to be applied to the magnetoresistive effect elements 1a is made smaller than the magnetic field to be applied to the magnetoresistive effect elements 1b, f1<f2 where f1 denotes the ferromagnetic resonance frequency of the magnetization free layer 4 in the magnetoresistive effect element 1a and f2 denotes the ferromagnetic resonance frequency of the magnetization free layer 4 in the magnetoresistive effect element 1b. Accordingly, as illustrated in FIG. 13, adjusting the strengths of the magnetic fields to be applied from the respective magnetic-field applying mechanisms 12 to the corresponding magnetoresistive effect elements 1a and 1b so that part of the frequencies near the ferromagnetic resonance frequency f1 of the magnetization free layer 4 in the magnetoresistive effect element 1a (a passband 300a illustrated in FIG. 13) is overlapped with part of the frequencies near the ferromagnetic resonance frequency f2 of the magnetization free layer 4 in the magnetoresistive effect element 1b (a passband 300b illustrated in FIG. 13) allows the magnetoresistive effect device 102 to have a passband (a passband 300 illustrated in FIG. 13) wider than that of the magnetoresistive effect device 100 of the first embodiment, as illustrated in FIG. 13.

Varying the direct current to be applied to each of the magnetoresistive effect elements 1a and 1b or the strengths of the magnetic fields to be applied from the respective magnetic-field applying mechanisms 12 to the corresponding magnetoresistive effect elements 1a and 1b enables the bandwidth of the magnetoresistive effect device 102 to be arbitrarily varied. Accordingly, the magnetoresistive effect device 102 is capable of functioning as a variable frequency filter capable of arbitrarily varying the passband 300 or an isolator. In addition, as in the magnetoresistive effect device 100 of the first embodiment, the magnetoresistive effect device 102 is also capable of functioning as a phase shifter capable of varying the phase of a signal or an amplifier capable of amplification of a signal. The phase shifter and the isolator use the passband 300 as the operating band.

As described above, since the magnetoresistive effect device 102 includes the multiple magnetic-field applying mechanisms 12 serving as the frequency setting mechanisms so as to individually set the ferromagnetic resonance frequencies of the magnetization free layers 4 in the multiple magnetoresistive effect elements 1a and 1b, the magnetoresistive effect device 102 is capable of individually controlling the ferromagnetic resonance frequencies of the magnetization free layers 4 in the respective magnetoresistive effect elements. Since the multiple magnetoresistive effect elements 1a and 1b are connected in parallel to each other, the high-frequency signals with higher strengths are supplied to the second port 9b near multiple frequencies that are the same as the ferromagnetic resonance frequencies of the magnetization free layers 4 in the respective magnetoresistive effect elements and the passband 300 having a certain width is provided. In addition, varying the direct current or the magnetic field to be applied to each of the magnetoresistive effect elements 1a and 1b enables the bandwidth of the magnetoresistive effect device 102 to be arbitrarily varied. In other words, the magnetoresistive effect device 102 is capable of functioning as a variable frequency filter capable of arbitrarily varying the passband 300 or an isolator. In addition, the magnetoresistive effect device 102 is also capable of functioning as a phase shifter or an amplifier, which use the passband 300 as the operating band.

Although the magnetoresistive effect device 102 of the third embodiment includes the two magnetoresistive effect elements 1a and 1b connected in parallel to each other and includes the two frequency setting mechanisms (magnetic-field applying mechanisms 12) so as to individually set the ferromagnetic resonance frequencies of the magnetization free layers 4 in the respective magnetoresistive effect elements 1a and 1b, the magnetoresistive effect device 102 of the third embodiment may include three or more magnetoresistive effect elements connected in parallel to each other and may include three or more frequency setting mechanisms (magnetic-field applying mechanisms 12) so as to individually set the ferromagnetic resonance frequencies of the magnetization free layers 4 in the respective magnetoresistive effect elements. In this case, it is possible to further increase the width of the passband.

Although the two magnetoresistive effect elements 1a and 1b have the same configuration in the magnetoresistive effect device 102 of the third embodiment, the multiple magnetoresistive effect elements may have different configurations.

Fourth Embodiment

Figure 14:
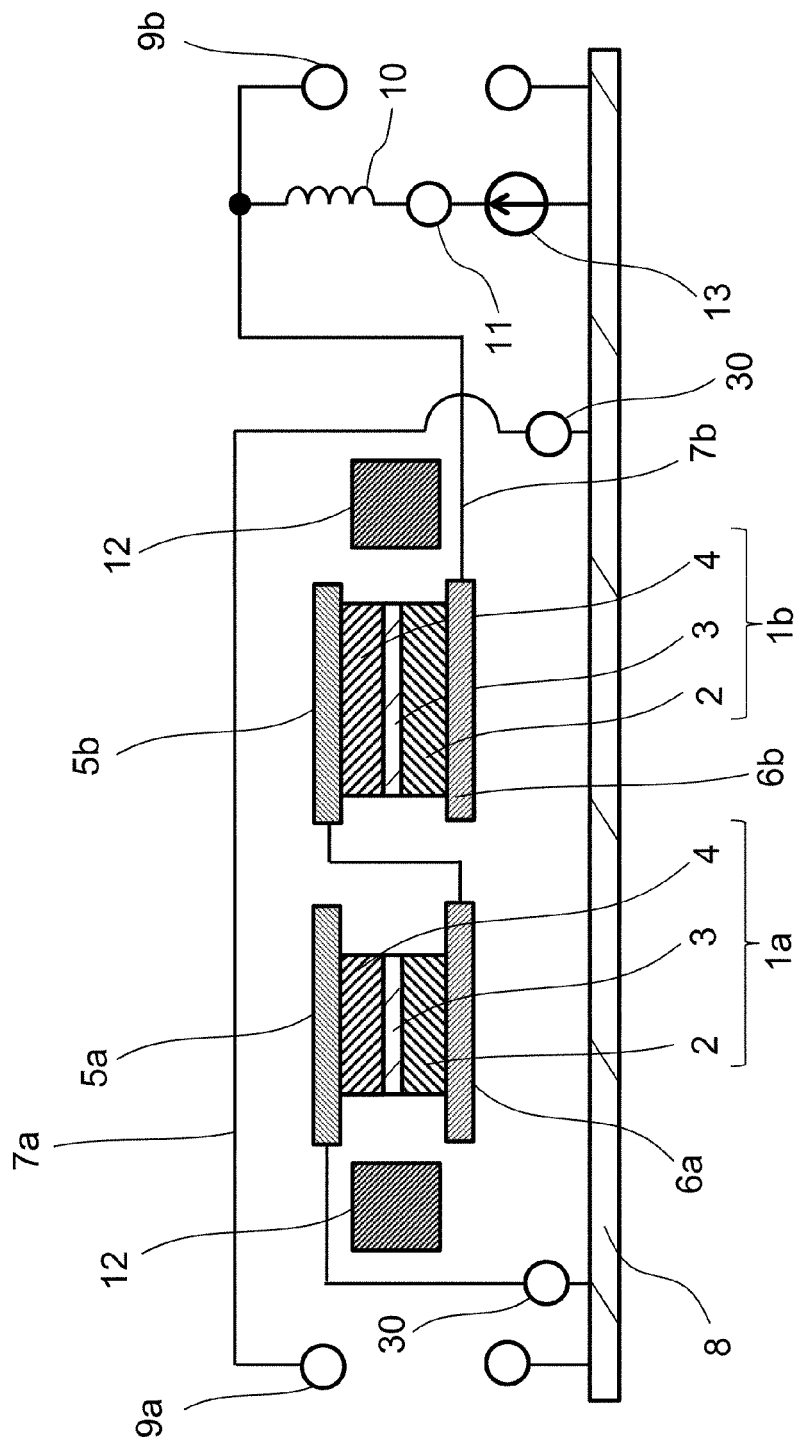
FIG. 14 is a schematic cross-sectional view illustrating an exemplary configuration of a magnetoresistive effect device according to a fourth embodiment.

FIG. 14 is a schematic cross-sectional view of a magnetoresistive effect device 103 according to a fourth embodiment of the present invention. Points different from the magnetoresistive effect device 100 of the first embodiment in the magnetoresistive effect device 103 will be mainly described and a description of common points will be appropriately omitted herein. The same reference numerals are used in the fourth embodiment to identify the same components in the magnetoresistive effect device 100 of the first embodiment and a description of the common components will be omitted herein. The magnetoresistive effect device 103 includes the two magnetoresistive effect elements 1a and 1b each including the magnetization fixed layer 2, the spacer layer 3, and the magnetization free layer 4, upper electrodes 5a and 5b, lower electrodes 6a and 6b, the first port 9a, the second port 9b, the first signal line 7a, the second signal line 7b, the inductor 10, the direct-current input terminal 11, and the magnetic-field applying mechanism 12 serving as the frequency setting mechanism. The magnetoresistive effect elements 1a and 1b are arranged so that the high-frequency magnetic field occurring from the first signal line 7a is applied to the magnetization free layers 4 in the magnetoresistive effect elements 1a and 1b. The upper electrode 5a and the lower electrode 6a are arranged so as to sandwich the magnetoresistive effect element 1a therebetween, and the upper electrode 5b and the lower electrode 6b are arranged so as to sandwich the magnetoresistive effect element 1b therebetween. The magnetoresistive effect elements 1a and 1b are connected in series to each other. One end (at the magnetization fixed layer 2 side) of the magnetoresistive effect element 1b is connected to the second port 9b via the lower electrode 6b and the second signal line 7b, one end (at the magnetization fixed layer 2 side) of the magnetoresistive effect element 1a is electrically connected to the other end (at the magnetization free layer 4 side) of the magnetoresistive effect element 1b via the lower electrode 6a and the upper electrode 5b, and the other end (at the magnetization free layer 4 side) of the magnetoresistive effect element 1a may be electrically connected to the ground 8 via the upper electrode 5a and the reference potential terminal 30.

The magnetoresistive effect element 1a differs from the magnetoresistive effect element 1b in their ferromagnetic resonance frequencies of the magnetization free layers 4 in the state in which the same direct-current magnetic field 12a and the direct current having the same current density are applied to the magnetoresistive effect elements 1a and 1b. More specifically, although the magnetoresistive effect elements 1a and 1b have the same film structure and each have a rectangular shape in plan view, the plan view shape of the magnetoresistive effect element 1a is different from the plan view shape of the magnetoresistive effect element 1a in the aspect ratio. "The same film structure" means that the magnetoresistive effect elements 1a and 1b have the same material and the same film thickness of each layer composing the magnetoresistive effect elements and have the same stacking order of the layers. "The plan view shape" means the shape of each of the magnetoresistive effect elements when the magnetoresistive effect element is viewed from above a plane perpendicular to the stacking direction of the respective layers composing the magnetoresistive effect element. "The aspect ratio" means the ratio of the length of long sides to the length of short sides of a rectangle circumscribed around the plan view shape of the magnetoresistive effect element with a minimum area.

The inductor 10 is connected between the second signal line 7b and the ground 8. The direct-current input terminal 11 is connected in series to the magnetoresistive effect elements 1a and 1b, which are connected in series to each other, and the inductor 10 and is connected to the second signal line 7b via the inductor 10 in parallel with the second port 9b. Connection of the direct-current source 13 to the direct-current input terminal 11 and the ground 8 enables a closed circuit including the magnetoresistive effect element 1a, the magnetoresistive effect element 1b, the second signal line 7b, the direct-current input terminal 11, and the ground 8 to be formed in the magnetoresistive effect device 103. The direct current supplied from the direct-current input terminal 11 flows through the closed circuit and is supplied to the magnetoresistive effect element 1a and the magnetoresistive effect element 1b.

The magnetic-field applying mechanism 12 is disposed near the magnetoresistive effect elements 1a and 1b and simultaneously applies the same direct-current magnetic field 12a to the magnetoresistive effect elements 1a and 1b to set the ferromagnetic resonance frequency of the magnetization free layer 4 in each of the magnetoresistive effect elements 1a and 1b. The magnetic-field applying mechanism 12 varies the effective magnetic field in the magnetization free layer 4 in each of the magnetoresistive effect elements 1a and 1b by varying the magnetic fields to be applied to the magnetoresistive effect elements 1a and 1b to enable the ferromagnetic resonance frequency of the magnetization free layer 4 in each of the magnetoresistive effect elements 1a and 1b to be varied.

Figure 15:
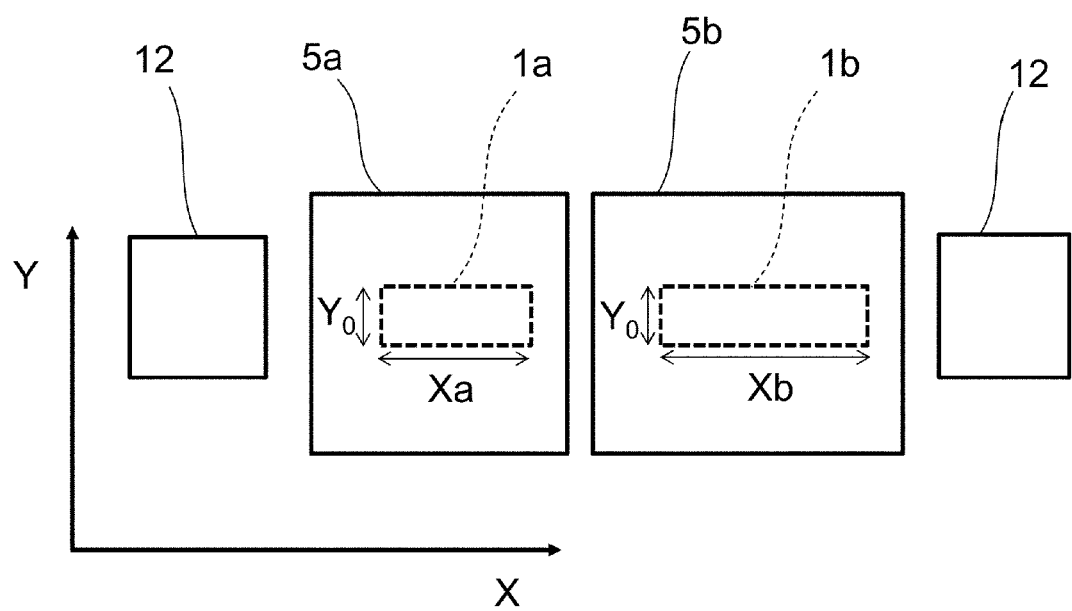
FIG. 15 is a top view of the magnetoresistive effect device according to the fourth embodiment.

The film structures of the magnetoresistive effect elements 1a and 1b are the same as the film structure of the magnetoresistive effect element 1a of the first embodiment. FIG. 15 is a top view of the magnetoresistive effect device 103. As illustrated in FIG. 15, the magnetoresistive effect elements 1a and 1b have the same dimension $Y_0$ in the Y direction, which is the direction of the short sides of the plan view shapes of the magnetoresistive effect elements 1a and 1b. However, the dimension Xa in the X direction, which is the direction of the long sides of the plane view shape of the magnetoresistive effect element 1a, is different from the dimension Xb in the X direction, which is the direction of the long sides of the plane view shape of the magnetoresistive effect element 1b, and Xa<Xb. Accordingly, the aspect ratio $(Xb/Y_0)$ of the plan view shape of the magnetoresistive effect element 1b is higher than the aspect ratio (Xa/Yd of the plan view shape of the magnetoresistive effect element 1a. In consideration of the state in which the same direct-current magnetic field 12a and the direct current of the same current density are applied to the magnetoresistive effect elements, the ferromagnetic resonance frequency of the magnetization free layer 4 in each of the magnetoresistive effect elements is increased with an increase in aspect ratio of the plan view shape of the magnetoresistive effect element. As a result, a ferromagnetic resonance frequency fb of the magnetization free layer 4 in the magnetoresistive effect element 1b is higher than a ferromagnetic resonance frequency fa of the magnetization free layer 4 in the magnetoresistive effect element 1a. Since differentiating the aspect ratios of the plan view shapes of the multiple magnetoresistive effect elements in the above manner enables the ferromagnetic resonance frequencies of the magnetization free layers to be differentiated from each other even when the magnetoresistive effect elements have the same film structure, it is possible to manufacture the multiple magnetoresistive effect elements differing in their ferromagnetic resonance frequencies of the magnetization free layers through the same film formation process. In other words, since the multiple magnetoresistive effect elements have the same film structure, it is possible to collectively form the films of the layers composing the multiple magnetoresistive effect elements. In addition, in the magnetoresistive effect device 103, since the magnetoresistive effect elements 1a and 1b are connected in series to each other and the area of the cross section of the magnetoresistive effect element 1a in a direction perpendicular to the direction in which the direct current flows is smaller than the area of the cross section of the magnetoresistive effect element 1b in the direction, the current density of the direct current applied to the magnetoresistive effect element 1a is higher than that of the direct current applied to the magnetoresistive effect element 1b. Accordingly, when the ferromagnetic resonance frequency of the magnetization free layer is decreased with the increasing current density of the applied direct current or when the effect of the difference in the aspect ratio of the plan view shape of the magnetoresistive effect element on the ferromagnetic resonance frequency of the magnetization free layer is greater than the effect of the difference in the current density of the applied direct current on the ferromagnetic resonance frequency of the magnetization free layer, the aspect ratio of the plan view shape of the magnetoresistive effect element 1a is different from that of the magnetoresistive effect element 1b and fa<fb.

The high-frequency magnetic field occurring from the first signal line 7a is simultaneously applied to the magnetization free layers 4 in the magnetoresistive effect elements 1a and 1b and the magnetization of the magnetization free layer 4 in each of the magnetoresistive effect elements 1a and 1b oscillates in response to the high-frequency magnetic field occurring from the first signal line 7a. Due to the magnetoresistive effect, upon oscillation of the magnetization of the magnetization free layers 4, the resistance values of the magnetoresistive effect elements 1a and 1b are varied with the input high-frequency signal. Upon application of the direct current from the direct-current input terminal 11, the high-frequency signal corresponding to the high-frequency signal input into the first port 9a is supplied from the magnetoresistive effect element 1a to the second port 9b as voltage, which is a product of the variable resistance value of the magnetoresistive effect element 1a and the direct current flowing thorough the magnetoresistive effect element 1a. Similarly, upon application of the direct current from the direct-current input terminal 11, the high-frequency signal corresponding to the high-frequency signal input into the first port 9a is supplied from the magnetoresistive effect element 1b to the second port 9b as voltage, which is a product of the variable resistance value of the magnetoresistive effect element 1b and the direct current flowing thorough the magnetoresistive effect element 1b.

The direction of the magnetization 16 of the magnetization fixed layer 2 in the magnetoresistive effect element 1a is the same as the direction of the magnetization 16 of the magnetization fixed layer 2 in the magnetoresistive effect element 1b. The first signal line 7a is preferably arranged with respect to the magnetoresistive effect elements 1a and 1b so that the angle formed by the straight line 2a parallel to the direction of magnetization 16 of the magnetization fixed layer 2 and the straight line 14 parallel to the direction of the high-frequency magnetic field in the magnetization free layer 4, which occurs from the first signal line 7a, is greater than or equal to five degrees and is smaller than or equal to 65 degrees. This angle is more preferably greater than or equal to 20 degrees and is smaller than or equal to 55 degrees. The magnetic-field applying mechanism 12 is arranged so that the direct-current magnetic field 12a is applied to the magnetization free layers 4 in the magnetoresistive effect elements 1a and 1b in the direction parallel to the first signal line 7a.

The frequency of the high-frequency magnetic field occurring from the first signal line 7a corresponds to the frequency of the high-frequency signal input into the first port 9a. Upon application of the high-frequency magnetic field occurring from the first signal line 7a to the magnetization free layers 4 in the magnetoresistive effect elements 1a and 1b, due to the ferromagnetic resonance effect of the magnetization free layers 4 in the magnetoresistive effect elements 1a and 1b, the magnetization of the magnetization free layer 4 greatly oscillates for high-frequency signals having frequencies near the ferromagnetic resonance frequency of the magnetization free layer 4 in the magnetoresistive effect element 1a or the magnetoresistive effect element 1b, among the input high-frequency signals, and the resistance value of the magnetoresistive effect element 1a or the magnetoresistive effect element 1b is greatly varied. Accordingly, the high-frequency signals having frequencies near the ferromagnetic resonance frequency of the magnetization free layer 4 in the magnetoresistive effect element 1a or the magnetoresistive effect element 1b are supplied from the magnetoresistive effect element 1a or the magnetoresistive effect element 1b to the second port 9b with greater strength, compared with the high-frequency signals having other frequencies. In other words, the magnetoresistive effect device 103 is capable of having frequency characteristics as a high-frequency filter that is capable of selectively passing the high-frequency signals having frequencies near the ferromagnetic resonance frequency of the magnetization free layer 4 in the magnetoresistive effect element 1a or the magnetoresistive effect element 1b (the frequencies of the pass band).

As in the magnetoresistive effect device 100 of the first embodiment, the magnetoresistive effect device 103 is also capable of functioning as an isolator.

Figure 16:
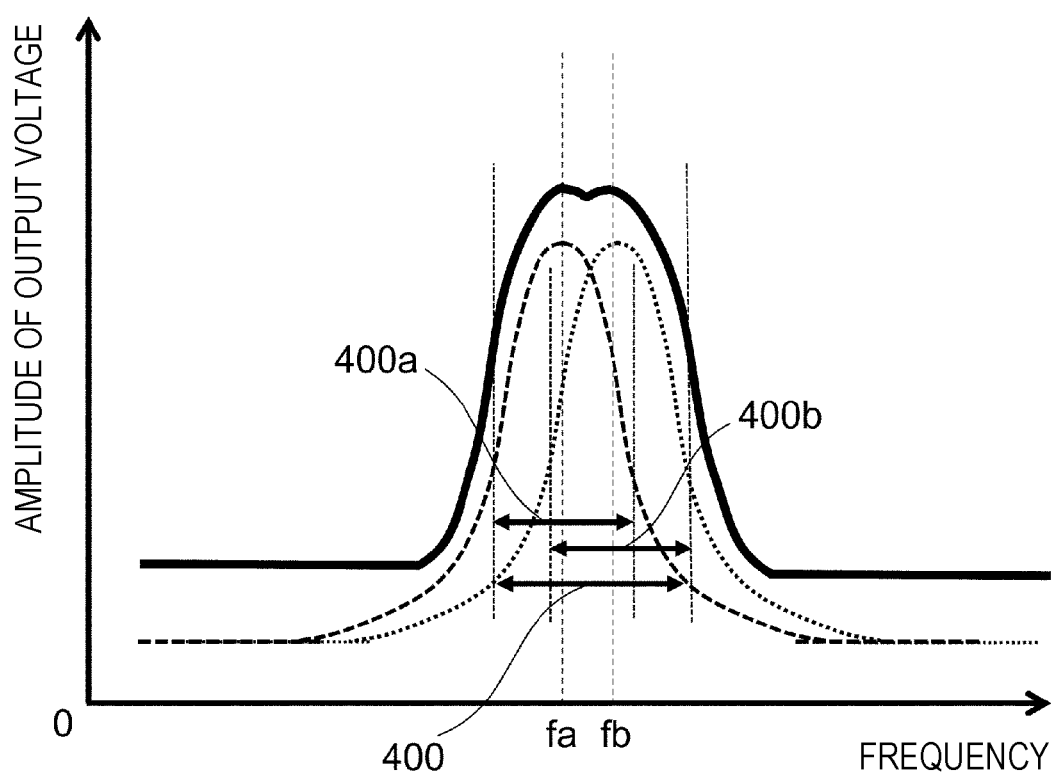
FIG. 16 is a graph illustrating the relationship between frequency and the amplitude of output voltage in the magnetoresistive effect device according to the fourth embodiment.

FIG. 16 is a graph illustrating the relationship between the frequency of a high-frequency signal input into the magnetoresistive effect device 103 and the amplitude of output voltage. Referring to FIG. 16, the vertical axis represents amplitude of output voltage and the horizontal axis represents frequency. As illustrated in FIG. 16, differentiating the aspect ratios of the plan view shapes of the magnetoresistive effect elements 1a and 1b from each other so that part of the frequencies near the ferromagnetic resonance frequency fa of the magnetization free layer 4 in the magnetoresistive effect element 1a (a passband 400a illustrated in FIG. 16) is overlapped with part of the frequencies near the ferromagnetic resonance frequency fb of the magnetization free layer 4 in the magnetoresistive effect element 1b (a passband 400b illustrated in FIG. 16) allows the magnetoresistive effect device 103 to have a passband (a passband 400 illustrated in FIG. 16) wider than that of the magnetoresistive effect device 100 of the first embodiment, as illustrated in FIG. 16.

Varying the direct current to be applied to the magnetoresistive effect elements 1a and 1b or the strength of the magnetic field to be applied from the magnetic-field applying mechanism 12 to the magnetoresistive effect elements 1a and 1b enables the bandwidth of the magnetoresistive effect device 103 to be arbitrarily varied. Accordingly, the magnetoresistive effect device 103 is capable of functioning as a variable frequency filter capable of arbitrarily varying the passband 400 or an isolator. In addition, as in the magnetoresistive effect device 100 of the first embodiment, the magnetoresistive effect device 103 is also capable of functioning as a phase shifter capable of varying the phase of a signal or an amplifier capable of amplification of a signal. The phase shifter and the isolator use the passband 400 as the operating band.

As described above, the multiple magnetoresistive effect elements 1a and 1b differing in their ferromagnetic resonance frequencies of the magnetization free layers 4 are connected in series to each other in the magnetoresistive effect device 103. Accordingly, the high-frequency signals with higher strengths are supplied to the second port 9b near multiple frequencies that are the same as the ferromagnetic resonance frequencies of the magnetization free layers 4 in the respective magnetoresistive effect elements 1a and 1b and the passband 400 having a certain width is provided. In addition, varying the direct current or the magnetic field to be applied to the magnetoresistive effect elements 1a and 1b enables the position of the passband 400 to be varied. In other words, the magnetoresistive effect device 103 is capable of functioning as a variable frequency filter capable of varying the position of the passband 400 or an isolator. In addition, the magnetoresistive effect device 103 is also capable of functioning as a phase shifter or an amplifier, which use the passband 400 as the operating band.

Since the plan view shapes of the multiple magnetoresistive effect elements 1a and 1b have different aspect ratios from each other in the magnetoresistive effect device 103, it is possible to manufacture the multiple magnetoresistive effect elements 1a and 1b differing in their ferromagnetic resonance frequencies of the magnetization free layers 4 through the same process. Specifically, since the multiple magnetoresistive effect elements 1a and 1b have the same film structure in the magnetoresistive effect device 103, it is possible to collectively form the films of the layers composing the multiple magnetoresistive effect elements 1a and 1b.

Although the two magnetoresistive effect elements 1a and 1b differing in their ferromagnetic resonance frequencies of the magnetization free layers 4 are connected in series to each other in the magnetoresistive effect device 103 of the fourth embodiment, three or more magnetoresistive effect elements differing in their ferromagnetic resonance frequencies of the magnetization free layers 4 may be connected in series to each other. In this case, it is possible to further increase the width of the passband.

Although the two magnetoresistive effect elements 1a and 1b have the same film structure in the magnetoresistive effect device 103 of the fourth embodiment, the multiple magnetoresistive effect elements may have different film structures. In this case, the different film structures may be used while the aspect ratios of the plane view shapes of the multiple magnetoresistive effect elements are made equal to each other to differentiate the ferromagnetic resonance frequencies of the magnetization free layers in the multiple magnetoresistive effect elements from each other.

Although the same magnetic field is simultaneously applied from the magnetic-field applying mechanism 12 to the magnetoresistive effect elements 1a and 1b in the magnetoresistive effect device 103 of the fourth embodiment, the magnetoresistive effect device 103 may include magnetic-field applying mechanisms for individually applying the magnetic fields to the respective magnetoresistive effect elements, as in the third embodiment.

Fifth Embodiment

Figure 17:
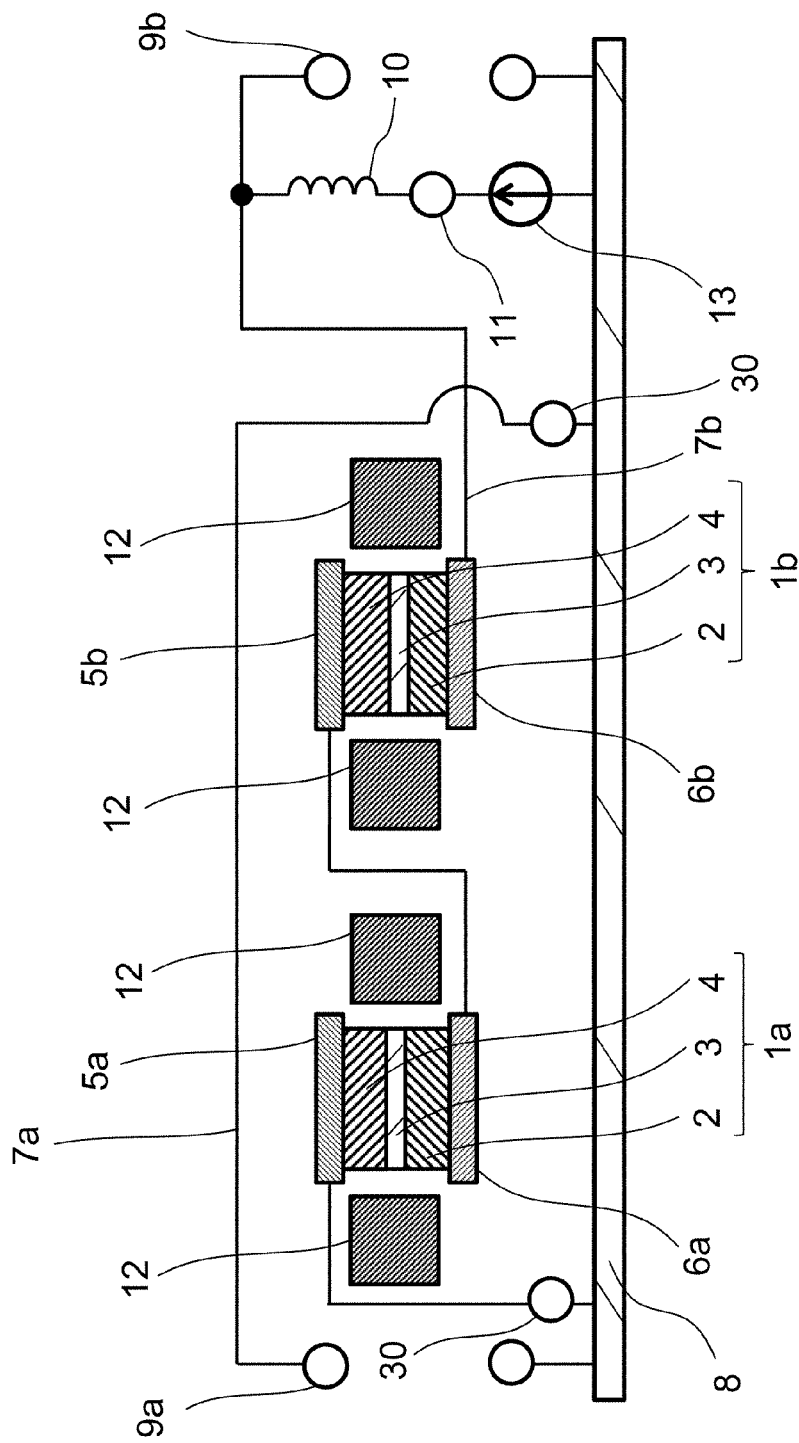
FIG. 17 is a schematic cross-sectional view illustrating an exemplary configuration of a magnetoresistive effect device according to a fifth embodiment.

FIG. 17 is a schematic cross-sectional view of a magnetoresistive effect device 104 according to a fifth embodiment of the present invention. Points different from the magnetoresistive effect device 100 of the first embodiment in the magnetoresistive effect device 104 will be mainly described and a description of common points will be appropriately omitted herein. The same reference numerals are used in the fifth embodiment to identify the same components in the magnetoresistive effect device 100 of the first embodiment and a description of the common components will be omitted herein. The magnetoresistive effect device 104 includes the two magnetoresistive effect elements 1a each including the magnetization fixed layer 2, the spacer layer 3, and the magnetization free layer 4, the upper electrodes 5a and 5b, the lower electrodes 6a and 6b, the first port 9a, the second port 9b, the first signal line 7a, the second signal line 7b, the inductor 10, the direct-current input terminal 11, and the two magnetic-field applying mechanisms 12 serving as the two frequency setting mechanisms. The magnetoresistive effect elements 1a and 1b are arranged so that the high-frequency magnetic field occurring from the first signal line 7a is applied to the magnetization free layers 4 in the magnetoresistive effect elements 1a and 1b. The two magnetoresistive effect elements 1a and 1b have the same configuration. The upper electrode 5a and the lower electrode 6a are arranged so as to sandwich the magnetoresistive effect element 1a therebetween, and the upper electrode 5b and the lower electrode 6b are arranged so as to sandwich the magnetoresistive effect element 1b therebetween. The magnetoresistive effect elements 1a and 1b are connected in series to each other. One end (at the magnetization fixed layer 2 side) of the magnetoresistive effect element 1b is connected to the second port 9b via the lower electrode 6b and the second signal line 7b, one end (at the magnetization fixed layer 2 side) of the magnetoresistive effect element 1a is electrically connected to the other end (at the magnetization free layer 4 side) of the magnetoresistive effect element 1b via the lower electrode 6a and the upper electrode 5b, and the other end (at the magnetization free layer 4 side) of the magnetoresistive effect element 1a may be electrically connected to the ground 8 via the upper electrode 5a and the reference potential terminal 30. The magnetic-field applying mechanisms 12 apply the individual direct-current magnetic fields 12a to the two respective magnetoresistive effect elements 1a and 1b. As described above, the magnetoresistive effect device 104 includes the two magnetic-field applying mechanisms 12 serving as the frequency setting mechanisms so that the ferromagnetic resonance frequencies of the respective magnetization free layers 4 in the two magnetoresistive effect elements 1a and 1b are capable of being individually set.

The inductor 10 is connected between the second signal line 7b and the ground 8. The direct-current input terminal 11 is connected in series to the magnetoresistive effect elements 1a and 1b, which are connected in series to each other, and the inductor 10 and is connected to the second signal line 7b via the inductor 10 in parallel with the second port 9b. Connection of the direct-current source 13 to the direct-current input terminal 11 and the ground 8 enables a closed circuit including the magnetoresistive effect element 1a, the magnetoresistive effect element 1b, the second signal line 7b, the direct-current input terminal 11, and the ground 8 to be formed in the magnetoresistive effect device 104. The direct current supplied from the direct-current input terminal 11 flows through the closed circuit and is supplied to the magnetoresistive effect element 1a and the magnetoresistive effect element 1b.

In the magnetoresistive effect device 104, the high-frequency magnetic field occurring from the first signal line 7a is simultaneously applied to the magnetization free layers 4 in the two magnetoresistive effect elements 1a and 1b in the state in which the direct-current magnetic fields 12a are individually applied from the respective magnetic-field applying mechanisms 12 to the corresponding magnetoresistive effect elements 1a and 1b. For example, the strength of the direct-current magnetic field 12a to be applied to the magnetoresistive effect element 1a is made smaller than the strength of the direct-current magnetic field 12a to be applied to the magnetoresistive effect element 1b. In this case, the ferromagnetic resonance frequency of the magnetization free layer 4 in the magnetoresistive effect element 1a is lower than the ferromagnetic resonance frequency of the magnetization free layer 4 in the magnetoresistive effect element 1b.

The high-frequency magnetic field occurring from the first signal line 7a is simultaneously applied to the magnetization free layers 4 in the magnetoresistive effect elements 1a and 1b and the magnetization of the magnetization free layer 4 in each of the magnetoresistive effect elements 1a and 1b oscillates in response to the high-frequency magnetic field occurring from the first signal line 7a. Due to the magnetoresistive effect, upon oscillation of the magnetization of the magnetization free layers 4, the resistance values of the magnetoresistive effect elements 1a and 1b are varied with the input high-frequency signal. Upon application of the direct current from the direct-current input terminal 11, the high-frequency signal corresponding to the high-frequency signal input into the first port 9a is supplied from the magnetoresistive effect element 1a to the second port 9b as voltage, which is a product of the variable resistance value of the magnetoresistive effect element 1a and the direct current flowing thorough the magnetoresistive effect element 1a. Similarly, upon application of the direct current from the direct-current input terminal 11, the high-frequency signal corresponding to the high-frequency signal input into the first port 9a is supplied from the magnetoresistive effect element 1b to the second port 9b as voltage, which is a product of the variable resistance value of the magnetoresistive effect element 1b and the direct current flowing thorough the magnetoresistive effect element 1b.

The direction of the magnetization 16 of the magnetization fixed layer 2 in the magnetoresistive effect element 1a is the same as the direction of the magnetization 16 of the magnetization fixed layer 2 in the magnetoresistive effect element 1b. The first signal line 7a is preferably arranged with respect to the magnetoresistive effect elements 1a and 1b so that the angle formed by the straight line 2a parallel to the direction of magnetization 16 of the magnetization fixed layer 2 and the straight line 14 parallel to the direction of the high-frequency magnetic field in the magnetization free layer 4, which occurs from the first signal line 7a, is greater than or equal to five degrees and is smaller than or equal to 65 degrees. This angle is more preferably greater than or equal to 20 degrees and is smaller than or equal to 55 degrees. The respective magnetic-field applying mechanisms 12 are arranged so that the direct-current magnetic fields 12a are applied to the magnetization free layers 4 in the magnetoresistive effect elements 1a and 1b in the direction parallel to the first signal line 7a.

The frequency of the high-frequency magnetic field occurring from the first signal line 7a corresponds to the frequency of the high-frequency signal input into the first port 9a. Upon application of the high-frequency magnetic field occurring from the first signal line 7a to the magnetization free layers 4 in the magnetoresistive effect elements 1a and 1b in the state in which the direct-current magnetic fields 12a are individually applied from the respective magnetic-field applying mechanisms 12 to the corresponding magnetoresistive effect elements 1a and 1b, due to the ferromagnetic resonance effect of the magnetization free layers 4 in the magnetoresistive effect elements 1a and 1b, the magnetization of the magnetization free layer 4 greatly oscillates for high-frequency signals having frequencies near the ferromagnetic resonance frequency of the magnetization free layer 4 in the magnetoresistive effect element 1a or the magnetoresistive effect element 1b, among the input high-frequency signals, and the resistance value of the magnetoresistive effect element 1a or the magnetoresistive effect element 1b is greatly varied. Accordingly, the high-frequency signals having frequencies near the ferromagnetic resonance frequency of the magnetization free layer 4 in the magnetoresistive effect element 1a or the magnetoresistive effect element 1b are supplied from the magnetoresistive effect element 1a or the magnetoresistive effect element 1b to the second port 9b with greater strength, compared with the high-frequency signals having other frequencies. In other words, the magnetoresistive effect device 104 is capable of having frequency characteristics as a high-frequency filter that is capable of selectively passing the high-frequency signals having frequencies near the ferromagnetic resonance frequency of the magnetization free layer 4 in the magnetoresistive effect element 1a or the magnetoresistive effect element 1b (the frequencies of the pass band).

As in the magnetoresistive effect device 100 of the first embodiment, the magnetoresistive effect device 104 is also capable of functioning as an isolator.

Figure 18:
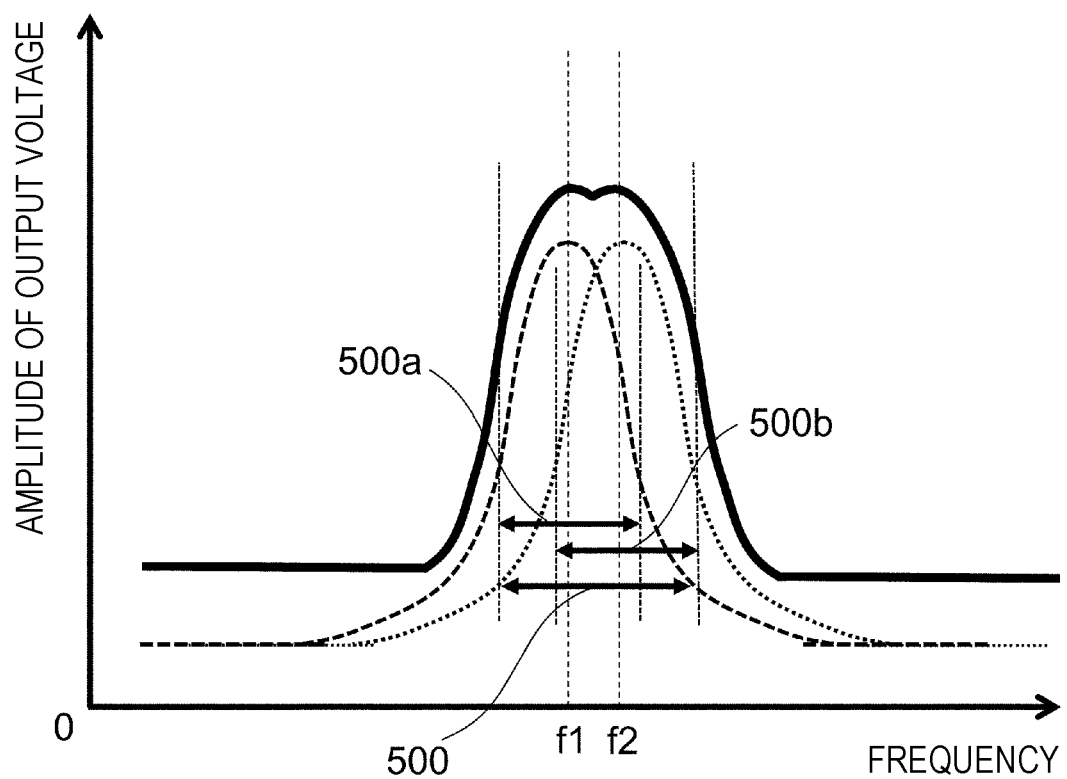
FIG. 18 is a graph illustrating the relationship between frequency and the amplitude of output voltage in the magnetoresistive effect device according to the fifth embodiment.

FIG. 18 is a graph illustrating the relationship between the frequency of a high-frequency signal input into the magnetoresistive effect device 104 and the amplitude of output voltage. Referring to FIG. 18, the vertical axis represents amplitude of output voltage and the horizontal axis represents frequency. For example, as illustrated in FIG. 18, when the magnetic field to be applied to the magnetoresistive effect elements 1a is made smaller than the magnetic field to be applied to the magnetoresistive effect elements 1b, $f1<f2$ where f1 denotes the ferromagnetic resonance frequency of the magnetization free layer 4 in the magnetoresistive effect element 1a and f2 denotes the ferromagnetic resonance frequency of the magnetization free layer 4 in the magnetoresistive effect element 1b. Accordingly, as illustrated in FIG. 18, adjusting the strengths of the magnetic fields to be applied from the respective magnetic-field applying mechanisms 12 to the corresponding magnetoresistive effect elements 1a and 1b so that part of the frequencies near the ferromagnetic resonance frequency f1 of the magnetization free layer 4 in the magnetoresistive effect element 1a (a passband 500a illustrated in FIG. 18) is overlapped with part of the frequencies near the ferromagnetic resonance frequency f2 of the magnetization free layer 4 in the magnetoresistive effect element 1b (a passband 500b illustrated in FIG. 18) allows the magnetoresistive effect device 104 to have a passband (a passband 500 illustrated in FIG. 18) wider than that of the magnetoresistive effect device 100 of the first embodiment, as illustrated in FIG. 18.

Varying the direct current to be applied to each of the magnetoresistive effect elements 1a and 1b or the strengths of the magnetic fields to be applied from the respective magnetic-field applying mechanisms 12 to the corresponding magnetoresistive effect elements 1a and 1b enables the bandwidth of the magnetoresistive effect device 104 to be arbitrarily varied. Accordingly, the magnetoresistive effect device 104 is capable of functioning as a variable frequency filter capable of arbitrarily varying the passband 500 or an isolator. In addition, as in the magnetoresistive effect device 100 of the first embodiment, the magnetoresistive effect device 104 is also capable of functioning as a phase shifter capable of varying the phase of a signal or an amplifier capable of amplification of a signal. The phase shifter and the isolator use the passband 500 as the operating band.

As described above, since the magnetoresistive effect device 104 includes the multiple magnetic-field applying mechanisms 12 serving as the frequency setting mechanisms so as to individually set the ferromagnetic resonance frequencies of the magnetization free layers 4 in the multiple magnetoresistive effect elements 1a and 1b, the magnetoresistive effect device 104 is capable of individually controlling the ferromagnetic resonance frequencies of the magnetization free layers 4 in the respective magnetoresistive effect elements. Since the multiple magnetoresistive effect elements 1a and 1b are connected in series to each other, the high-frequency signals with higher strengths are supplied to the second port 9b near multiple frequencies that are the same as the ferromagnetic resonance frequencies of the magnetization free layers 4 in the respective magnetoresistive effect elements and the passband 500 having a certain width is provided. In addition, varying the direct current or the magnetic field to be applied to each of the magnetoresistive effect elements 1a and 1b enables the bandwidth of the magnetoresistive effect device 104 to be arbitrarily varied. In other words, the magnetoresistive effect device 104 is capable of functioning as a variable frequency filter capable of arbitrarily varying the passband 500 or an isolator. In addition, the magnetoresistive effect device 104 is also capable of functioning as a phase shifter or an amplifier, which use the passband 500 as the operating band.

Although the magnetoresistive effect device 104 of the fifth embodiment includes the two magnetoresistive effect elements 1a and 1b connected in series to each other and includes the two frequency setting mechanisms (magnetic-field applying mechanisms 12) so as to individually set the ferromagnetic resonance frequencies of the magnetization free layers 4 in the respective magnetoresistive effect elements 1a and 1b, the magnetoresistive effect device 104 of the fifth embodiment may include three or more magnetoresistive effect elements connected in series to each other and may include three or more frequency setting mechanisms (magnetic-field applying mechanisms 12) so as to individually set the ferromagnetic resonance frequencies of the magnetization free layers 4 in the respective magnetoresistive effect elements. In this case, it is possible to further increase the width of the passband.

Although the two magnetoresistive effect elements 1a and 1b have the same configuration in the magnetoresistive effect device 104 of the fifth embodiment, the multiple magnetoresistive effect elements may have different configurations.

Although the embodiments of the present invention have been described above, it will be clear that the present invention is not limited to these specific examples and embodiments and that many changes and modified embodiments will be obvious to those skilled in the art. For example, although the example is described in the first to fifth embodiments in which the direct-current input terminal 11 is connected between the inductor 10 and the ground 8, the direct-current input terminal 11 may be connected between the upper electrode 5 (5a) and the ground 8 so as to be connected in series to the magnetoresistive effect element 1a (1b), the direct-current source 13 may be connected to the direct-current input terminal 11 and the ground 8, the inductor 10 may be connected to the second signal line 7b so as to be connected to the second signal line 7b in parallel with the second port 9b, and the inductor 10 may be connected to the ground 8 via the reference potential terminal 30.

Instead of the inductor 10 in the first to fifth embodiments, a resistance element may be used. In this case, the resistance element has a function to cut off high-frequency components of current with its resistance component. The resistance element may be a chip resistor or a pattern line. The resistance value of the resistance element is preferably higher than the characteristic impedance of the second signal line 7b. For example, when the characteristic impedance of the second signal line 7b is 50 Ω, 45% of high-frequency power is capable of being cut with the resistance element if the resistance value of the resistance element is 50Ω and 90% of high-frequency power is capable of being cut with the resistance element if the resistance value of the resistance element is 500Ω. The direct current supplied from the direct-current input terminal 11 flows through a closed circuit including the magnetoresistive effect element 1a (1b), the second signal line 7b, the resistance element, the direct-current input terminal 11, and the ground 8. With this closed circuit, the direct current is capable of being efficiently applied to the magnetoresistive effect element 1a (1b).

When the resistance element is used, instead of the inductor 10 in the first to fifth embodiments, a capacitor for cutting off the direct-current signal is preferably connected in series to the second signal line 7b between a connection portion of the resistance element to the second signal line 7b and the second port 9b. This is because the direct current applied from the direct-current input terminal 11 efficiently flows through the closed circuit including the magnetoresistive effect element 1a (1b), the second signal line 7b, the resistance element, the direct-current input terminal 11, and the ground 8 in this case.

The inductor 10 may not be provided in the first to fifth embodiments if the direct-current source 13 connected to the direct-current input terminal 11 has a function to cut off the high-frequency components of current and pass the direct-current components of the current. Also in this case, the direct current supplied from the direct-current input terminal 11 flows through a closed circuit including the magnetoresistive effect element 1a (1b), the second signal line 7b, the direct-current input terminal 11, and the ground 8. With this closed circuit, the direct current is capable of being efficiently applied to the magnetoresistive effect element 1a (1b).

Although the example is described in the first to fifth embodiments in which the magnetoresistive effect device 100 (101, 102, 103, and 104) includes the magnetic-field applying mechanism 12 as the frequency setting mechanism (effective magnetic field setting mechanism), the frequency setting mechanism (the effective magnetic field setting mechanism) may be realized in the following manners. For example, the anisotropy magnetic field $H_k$ in the magnetization free layer may be varied by applying an electric field to the magnetoresistive effect element and varying the electric field to vary the effective magnetic field in the magnetization free layer, thus varying the ferromagnetic resonance frequency of the magnetization free layer in the magnetoresistive effect element. In this case, the mechanism to apply the electric field to the magnetoresistive effect element serves as the frequency setting mechanism (the effective magnetic field setting mechanism). Alternatively, the anisotropy magnetic field $H_k$ in the magnetization free layer may be varied by providing a piezoelectric body near the magnetization free layer, applying the electric field to the piezoelectric body, deforming the piezoelectric body, and distorting the magnetization free layer to vary the effective magnetic field in the magnetization free layer, thus varying the ferromagnetic resonance frequency of the magnetization free layer in the magnetoresistive effect element. In this case, the mechanism to apply the electric field to the piezoelectric body and the piezoelectric body serve as the frequency setting mechanism (the effective magnetic field setting mechanism). Alternatively, the exchange coupling magnetic field $H_{EX}$ in the magnetization free layer may be varied by providing a control film formed of an antiferromagnetic body or a ferrimagnetic body having an electromagnetic effect so as to be magnetically coupled to the magnetization free layer, applying the magnetic field and the electric field to the control film, and varying at least one of the magnetic field and the electric field to be applied to the control film to vary the effective magnetic field in the magnetization free layer, thus varying the ferromagnetic resonance frequency of the magnetization free layer in the magnetoresistive effect element. In this case, the mechanism to apply the magnetic field to the control film, the mechanism to apply the electric field to the control film, and the control film serve as the frequency setting mechanism (the effective magnetic field setting mechanism).

Even when the frequency setting mechanism is not provided (the direct-current magnetic field is not applied from the magnetic-field applying mechanism 12), the frequency setting mechanism (the magnetic-field applying mechanism 12) may not be provided if the magnetization free layer 4 in each magnetoresistive effect element has a desired ferromagnetic resonance frequency.

The magnetoresistive effect device 100 (101, 102, 103, and 104) may include at least one of a resistance element, an inductor, and a capacitor, which are connected to the first signal line 7a, in the first to fifth embodiments. Adjusting the impedance with at least one of the resistance element, the inductor, and the capacitor enables impedance matching to be performed in the first port 9a.

Although a mode is described in the first to fifth embodiments in which a high-frequency signal, which is a single-end signal, is input into the first port 9a in the magnetoresistive effect device 100 (101, 102, 103, and 104), a mode may be realized in which a high-frequency signal, which is a differential signal, is input into the first port 9a. Also in this case, the magnetoresistive effect device 100 (101, 102, 103, and 104) may include at least one of a resistance element, an inductor, and a capacitor, which are connected to the first signal line 7a. Adjusting the impedance with at least one of the resistance element, the inductor, and the capacitor enables the impedance matching to be performed in the first port 9a. FIG. 19 is a schematic cross-sectional view of a magnetoresistive effect device 105, which results from modification of the magnetoresistive effect device 100 of the first embodiment and in which a high-frequency signal, which is a differential signal, is input into the first port 9a. In the magnetoresistive effect device 105, the first signal line 7a is not connected to the ground 8 and is connected to the first port 9a into which a high-frequency signal, which is a differential signal, is input. A resistance element 31 is connected to the first signal line 7a. Since a high-frequency signal, which is a differential signal, is input into the first port 9a and a high-frequency signal, which is a single-end signal, is output from the second port 9b in the magnetoresistive effect device 105, the magnetoresistive effect device 105 is capable of functioning as a balun. Similarly, a magnetoresistive effect device resulting from modification of the magnetoresistive effect device 101, 102, 103, or 104 to a mode in which a high-frequency signal, which is a differential signal, is input into the first port 9a is also capable of functioning as a balun.

What is claimed is:

1. A magnetoresistive effect device comprising:
   at least one magnetoresistive effect element including a magnetization fixed layer, a spacer layer, and a magnetization free layer a direction of magnetization of which is capable of being varied;
   a first port into which a high-frequency signal is input;
   a second port from which a high-frequency signal is output;
   a first signal line which is connected to the first port and through which high-frequency current corresponding to the high-frequency signal input into the first port flows;
   a second signal line; and
   a direct-current input terminal,
   wherein the magnetoresistive effect element is arranged so that a high-frequency magnetic field occurring from the first signal line is applied to the magnetization free layer,
   wherein the magnetoresistive effect element is connected to the second port via the second signal line, and
   wherein the direct-current input terminal is connected to the magnetoresistive effect element.

2. The magnetoresistive effect device according to claim 1, further comprising:
   at least one frequency setting mechanism capable of setting a ferromagnetic resonance frequency of the magnetization free layer.

3. The magnetoresistive effect device according to claim 2,
   wherein the frequency setting mechanism is an effective magnetic field setting mechanism capable of setting an effective magnetic field in the magnetization free layer and the ferromagnetic resonance frequency of the magnetization free layer is capable of being varied by varying the effective magnetic field.

4. The magnetoresistive effect device according to claim 1,
   wherein an angle formed by a straight line parallel to a direction of magnetization of the magnetization fixed layer and a straight line parallel to the direction of the high-frequency magnetic field in the magnetization free layer is greater than or equal to five degrees and is smaller than or equal to 65 degrees.

5. The magnetoresistive effect device according to claim 4, wherein the angle is greater than or equal to 20 degrees and is smaller than or equal to 55 degrees.

6. The magnetoresistive effect device according to claim 1, wherein the at least one magnetoresistive effect element includes a plurality of magnetoresistive effect elements differing in their ferromagnetic resonance frequencies of the magnetization free layers and the plurality of magnetoresistive effect elements are connected in parallel to each other.

7. The magnetoresistive effect device according to claim 2, wherein the at least one magnetoresistive effect element includes a plurality of magnetoresistive effect elements and the plurality of magnetoresistive effect elements are connected in parallel to each other, and
wherein the at least one frequency setting mechanism includes a plurality of frequency setting mechanisms so as to individually set the ferromagnetic resonance frequencies of the magnetization free layers in the plurality of magnetoresistive effect elements.

8. The magnetoresistive effect device according to claim 1, wherein the at least one magnetoresistive effect element includes a plurality of magnetoresistive effect elements differing in their ferromagnetic resonance frequencies of the magnetization free layers and the plurality of magnetoresistive effect elements are connected in series to each other.

9. The magnetoresistive effect device according to claim 2, wherein the at least one magnetoresistive effect element includes a plurality of magnetoresistive effect elements and the plurality of magnetoresistive effect elements are connected in series to each other, and
wherein the at least one frequency setting mechanism includes a plurality of frequency setting mechanisms so as to individually set the ferromagnetic resonance frequencies of the magnetization free layers in the plurality of magnetoresistive effect elements.

10. The magnetoresistive effect device according to claim 6, wherein plan view shapes of the plurality of magnetoresistive effect elements differing in their ferromagnetic resonance frequencies of the magnetization free layers have different aspect ratios.

11. The magnetoresistive effect device according to claim 8, wherein plan view shapes of the plurality of magnetoresistive effect elements differing in their ferromagnetic resonance frequencies of the magnetization free layers have different aspect ratios.

* * * * *